US011431236B2

(12) United States Patent
Scheller et al.

(10) Patent No.: US 11,431,236 B2
(45) Date of Patent: Aug. 30, 2022

(54) DYNAMICALLY ADDRESSABLE HIGH VOLTAGE OPTICAL TRANSFORMER WITH INTEGRATED OPTICALLY TRIGGERED SWITCHES

(71) Applicant: META PLATFORMS TECHNOLOGIES, LLC, Menlo Park, CA (US)

(72) Inventors: Maik Andre Scheller, Redmond, WA (US); Christopher Yuan Ting Liao, Seattle, WA (US); Jonathan Robert Peterson, Woodinville, WA (US); Andrew John Ouderkirk, Redmond, WA (US)

(73) Assignee: META PLATFORMS TECHNOLOGIES, LLC, Menlo Park, CA (US)

( * ) Notice: Subject to any disclaimer, the term of this patent is extended or adjusted under 35 U.S.C. 154(b) by 172 days.

(21) Appl. No.: 16/996,588

(22) Filed: Aug. 18, 2020

(65) Prior Publication Data
US 2022/0057614 A1    Feb. 24, 2022

(51) Int. Cl.
*H02M 1/00* (2006.01)
*H01S 3/106* (2006.01)
(Continued)

(52) U.S. Cl.
CPC ......... *H02M 1/0077* (2021.05); *H01S 3/1061* (2013.01); *H02M 1/0067* (2021.05);
(Continued)

(58) Field of Classification Search
CPC ............. H02M 1/0077; H02M 1/0067; H02M 1/0083; H03F 3/08
(Continued)

(56) References Cited

U.S. PATENT DOCUMENTS 4,730,115 A    3/1988  Abe
5,248,931 A    9/1993  Flesner et al.
(Continued)

FOREIGN PATENT DOCUMENTS

DE    102019103805 A1    8/2020
FR       2525831 A1    10/1983

OTHER PUBLICATIONS

Helmers H., et al., "Photovoltaic Cells with Increased Voltage Output for Optical Power Supply of Sensor Electronics," 7th International Conference on Sensors and Measurement Technology, May 2015, 6 pages.
(Continued)

*Primary Examiner* — Tomi Skibinski
(74) *Attorney, Agent, or Firm* — Morgan, Lewis & Bockius LLP

(57) ABSTRACT

An optical transformer includes a plurality of light emitters, a plurality of photovoltaic cells positioned to receive light from at least a first subset of the plurality of light emitters, the plurality of photovoltaic cells including at least a first photovoltaic cell and a second photovoltaic cell, and one or more optically triggered switches positioned to receive light from at least a second subset of the plurality of light emitters, the one or more optically triggered switches including at least a first optically triggered switch electrically coupled to the first photovoltaic cell and the second photovoltaic cell. A method of operating the optical transformer is also described.

20 Claims, 17 Drawing Sheets

(51) Int. Cl.
*H03F 3/08* (2006.01)
*G02B 19/00* (2006.01)

(52) U.S. Cl.
CPC ............ *H02M 1/0083* (2021.05); *H03F 3/08* (2013.01); *G02B 19/0052* (2013.01); *G02B 19/0066* (2013.01)

(58) Field of Classification Search
USPC .......................................................... 330/59
See application file for complete search history.

(56) References Cited

U.S. PATENT DOCUMENTS

| | | | |
|---|---|---|---|
| 6,265,653 B1 | 7/2001 | Haigh et al. | |
| 6,304,428 B1 | 10/2001 | Sato | |
| 6,316,715 B1 | 11/2001 | King et al. | |
| 6,359,210 B2 | 3/2002 | Ho et al. | |
| 7,941,022 B1 * | 5/2011 | Schaffner | H04B 10/807 |
| | | | 398/171 |
| 10,499,466 B1 | 12/2019 | Miskin et al. | |
| 2002/0153037 A1 * | 10/2002 | Fischer | H01L 27/142 |
| | | | 257/E27.125 |
| 2011/0209761 A1 | 9/2011 | Counil et al. | |
| 2013/0119409 A1 | 5/2013 | Zhao | |
| 2014/0061679 A1 | 3/2014 | Guo | |
| 2017/0083095 A1 | 3/2017 | Lee et al. | |
| 2021/0083141 A1 | 3/2021 | Scheller et al. | |

OTHER PUBLICATIONS

International Search Report and Written Opinion for International Application No. PCT/US2021/046057, dated Nov. 15, 2021, 11 pages.
"Opto-Isolator—Wikipedia," May 5, 2018, XP055857857, [Retrieved on Nov. 18, 2021], 4 pages, Retrieved from the Internet: https://en.wikipedia.org/wiki/Optical_isolator.
International Search Report and Written Opinion for International Application No. PCT/US2020/047557, dated Nov. 11, 2020, 11 pages.
Silvestre S., et al., "Study of Bypass Diodes Configuration on PV Modules," Applied Energy, Sep. 2009, vol. 86 (9), pp. 1632-1640.
Final Office Action dated Mar. 14, 2022 for U.S. Appl. No. 16/841,519, filed Apr. 6, 2020, 20 pages.
International Preliminary Report on Patentability for International Application No. PCT/US2020/047557, dated Mar. 31, 2022, 9 pages.
Non-Final Office Action dated Dec. 27, 2021 for U.S. Appl. No. 16/841,519, filed Apr. 6, 2020, 15 pages.
Restriction Requirement dated Aug. 20, 2021 for U.S. Appl. No. 16/841,519, filed Apr. 6, 2020, 9 Pages.

* cited by examiner

```
1100
```

| 1102 Receive an electrical input to an optical transformer and generate light with the one or more light sources of the first subset of the plurality of light sources of the optical transformer |
|---|
| 1104 Generate light with a first group of one or more light sources of the second subset of the plurality of light sources and providing the light from the first group of one or more light sources to a first subset of the one or more optically triggered switches at a first time. Forgo generation of light with the first group of one or more light sources of the second subset of the plurality of light sources and provision of the light from the first group of one or more light sources to the first subset of the one or more optically triggered switches at a second time that is distinct from the first time. |
| 1106 Generate light with a first group of one or more light sources of the second subset of the plurality of light sources and providing the light from the first group of one or more light sources to a first subset of the one or more optically triggered switches at a first time. Generate light with a second group of one or more light sources of the second subset of the plurality of light sources and providing the light from the second group of one or more light sources to a second subset of the one or more optically triggered switches at a second time that is distinct from the first time. |

| 1108 Provide the light to the plurality of photovoltaic cells of the optical transformer to obtain an electrical output |
|---|
| 1110 The electrical input has a first voltage and the electrical output has a second voltage that is greater than the first voltage |

Figure 11

DYNAMICALLY ADDRESSABLE HIGH VOLTAGE OPTICAL TRANSFORMER WITH INTEGRATED OPTICALLY TRIGGERED SWITCHES

RELATED APPLICATIONS

This application is related to U.S. Provisional Application No. 62/900,672, filed Sep. 16, 2019; U.S. patent application Ser. No. 16/594,346, filed Jan. 24, 2020; and U.S. patent application Ser. No. 16/775,607, filed Jan. 29, 2020, all of which are incorporated by reference herein in their entireties.

TECHNICAL FIELD

This application relates generally to transformers, and more specifically to transformers with optical components.

BACKGROUND

A transformer is an electrical device that is commonly used for power transfer and voltage conversion (e.g., providing a high voltage output from a low voltage input). However, such conventional transformers are bulky and heavy, and the size and weight of conventional transformers have limited their applications, especially in portable electronic devices.

SUMMARY

Accordingly, there is a need for compact and light-weighted transformers. As described below, optical transformers described herein are compact and light-weighted. Such optical transformers may be used for voltage conversion.

Conventional high voltage transformers are typically tailored for a specific application by optimizing the voltage and current of the output. However, the ability to reconfigure high voltage transformers dynamically for different load conditions is desirable, as such reconfigurability improves the efficiency of high voltage transformers and expands applications in which high voltage transformers can be used. Several features described herein enable dynamic reconfiguration of optical transformers.

In accordance with some embodiments, an optical transformer includes optical transformer includes a plurality of light emitters, a plurality of photovoltaic cells positioned to receive light from at least a first subset of the plurality of light emitters, the plurality of photovoltaic cells including at least a first photovoltaic cell and a second photovoltaic cell, and one or more optically triggered switches positioned to receive light from at least a second subset of the plurality of light emitters, the one or more optically triggered switches including at least a first optically triggered switch electrically coupled to the first photovoltaic cell and the second photovoltaic cell.

In accordance with some embodiments, a method includes receiving an electrical input to any optical transformer described herein and generating light with one or more light emitters of the first subset of the plurality of light emitters of the optical transformer; and providing the light to the plurality of photovoltaic cells of the optical transformer to obtain an electrical output.

For example, optically triggered switches (e.g., photoconductive switches) may be integrated with the optical transformers. Such optically triggered switches provide extremely low leakage currents, high breakdown voltage, and minimal resistance when switched on (e.g., by light). The light required for switching may be generated from the same or similar light emitters (e.g. VCSEL or LED array) used to drive the photovoltaic cells, which simplifies the design and fabrication of dynamically reconfigurable optical transformers. In addition, without using bidirectional triode thyristor the size of dynamically reconfigurable optical transformers can be reduced. Furthermore, the light can be controlled with a low voltage which enables these switches to be operated without the need of additional high voltage source or high voltage circuitry.

Thus, the disclosed embodiments provide dynamically reconfigurable compact and light-weighted transformers. Because the described optical transformers are compact, light-weighted, and dynamically reconfigurable, such optical transformers may complement or replace conventional transformers in various applications, including applications in portable electronic devices.

BRIEF DESCRIPTION OF THE DRAWINGS

The accompanying drawings illustrate a number of exemplary embodiments and are a part of the specification. Together with the following description, these drawings demonstrate and explain various principles of the present disclosure.

FIG. 11 is a flow diagram illustrating a method for operating an optical transformer in accordance with some embodiments.

Figure 1A:
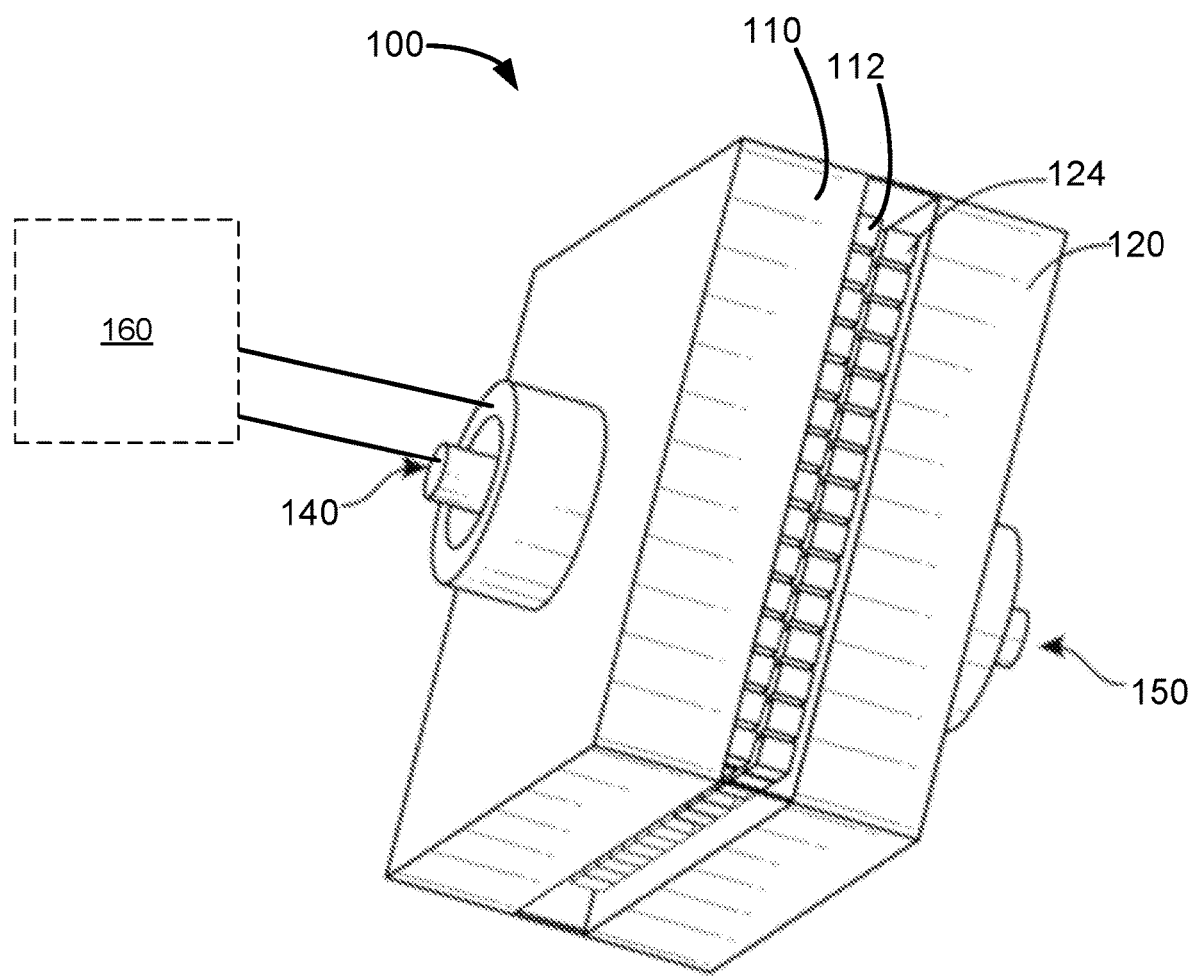
FIG. 1A is a schematic illustration of an example optical transformer in accordance with some embodiments.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

These figures are not drawn to scale unless indicated otherwise.

DETAILED DESCRIPTION

High voltages may be necessary to operate a variety of different devices and systems, including high voltage relays, cathode ray tubes, e.g., to generate x-rays and particle beams, and piezoelectric actuators, e.g., to manipulate the focal length of variable focal length lenses. In this regard, a voltage transformer may be employed to increase voltage output where the voltage of an existing voltage (or power) source is insufficient. Many voltage transformers, including step-up converters (booster converters) and piezo-transformers, for example, may be configured to convert relatively low DC input voltages (~1 V-3.6 V), including those available from portable batteries, such as lithium ion batteries, to output voltages greater than 1 kV. However, the design of many such voltage transformers, including the requisite inductors and capacitors, may unduly increase the size of the device (e.g., to 1 cm$^3$ and greater), which may be excessive for many applications, including wearable devices. Thus, notwithstanding recent developments, it would be advantageous to provide an economical high voltage source having a compact footprint.

The present disclosure is generally directed to voltage transformers, and more specifically to optical transformers. Such optical transformers may include an integrated array of monolithic photovoltaic cells. In certain embodiments, micrometer-scale photovoltaic cells may be arrayed to form an optical transformer having commercially-relevant dimensions. For example, in combination with a light source powered by a DC voltage source, an optical transformer (DC to DC converter) may exhibit a footprint of less than approximately 5 mm$^3$. Example optical transformers may be configured to provide scalable output, e.g., open-circuit voltages from approximately 1V to greater than approximately 1 kV, e.g., 1, 2, 5, 10, 20, 50, 100, 200, 500, or 1000 V or more, including ranges between any of the foregoing values.

In certain embodiments, an optical transformer may include a light source and an array of photovoltaic cells optically coupled to the light source, where at least a portion of the photovoltaic cells are connected in series.

By way of example, the light source may include a surface-emitting device, e.g., a top- or bottom-emitting device such as a vertical cavity surface emitting laser (VCSEL), a vertical external cavity surface emitting laser (VECSEL), or a light-emitting diode (LED) such as an organic light emitting diode (OLED) or a resonant cavity light emitting diode (RCLED). In some embodiments, the light source may include an edge-emitting device, e.g., a laser diode or a superluminescent diode (SLED). In certain embodiments, the light source may include a single emitter or a plurality of emitters. In some embodiments, the plurality of emitters is arranged in an addressable array.

By way of example, a light source including a laser diode or a light emitting diode may include an indirect bandgap semiconductor or a direct bandgap semiconductor, such as Si, GaAs, InGaAs, AlGaAs, GaN, InGaN, AlGaN, GaP, GaAsP, AlGaInP, and the like. In some embodiments, the light source may include one or more optical elements configured to enhance light extraction and focusing efficiency, such as one or more micro lenses, total internal reflection (TIR) concentrators and/or total internal reflection-refraction (TIR-R) concentrators.

According to certain embodiments, the optical power generation of the light source and hence the output voltage of the optical transformer may be controlled by voltage or current modulation. Such modulation may be analog (e.g., current amplitude modulation) or digital (e.g., pulse width modulation). A proportional-integral-derivative (PID) control circuit may be used to control the modulation and stabilize the output voltage.

The light source may be configured to illuminate one or more photovoltaic cells within a photovoltaic cell array. Example photovoltaic cells may use a p-n junction (or p-i-n-junction) within a semiconductor to obtain a current from photons absorbed near the junction. As a direct bandgap material, gallium arsenide (GaAs) is highly absorbing to photons having an energy greater than its bandgap ($E_g$). Further example direct bandgap semiconductors include InGaAs, AlGaAs, GaN, InGaN, AlGaN, GaP, GaAsP, AlGaInP, and the like. In alternate embodiments, the photovoltaic cells may be manufactured from an indirect bandgap semiconductor such as silicon (Si). For instance, an example monolithic integrated micro photovoltaic cell array may include silicon, where the p-n junctions (or p-i-n junctions) may be formed by lateral doping profiles.

An alternate approach to the development of a photovoltaic cell array is through the use of metal-semiconductor Schottky barriers to replace the semiconductor-semiconductor p-n junctions. Schottky barriers may be adaptable to economical, versatile manufacturing techniques and are suitable for polycrystalline-based devices. Additionally, since the collecting junction is located at the surface of the device, the collection efficiency through decreased surface recombination may be improved relative to a p-n junction. According to still further embodiments, the photovoltaic cells may include quantum dots or a quantum well. As will be appreciated, the bandgap of a quantum dot may be adjusted through a wide range of energy levels by changing the size of the dot.

As disclosed herein, plural photovoltaic cells within an array may be at least partially connected in series. In some embodiments, groups of cells may be connected in parallel to control (e.g., increase) the output current. That is, a photovoltaic cell array may include sub-arrays respectively configured in series and in parallel. Moreover, according to some embodiments, individual photovoltaic cells may be illuminated selectively to control the output voltage of the optical transformer. In certain embodiments, to improve the light absorption efficiency, the light source may have an emission spectrum selected to overlap the absorption profile of the photovoltaic cells.

The photovoltaic cell array may further include one or more bypass diodes, which may be connected in parallel to an individual cell or groups of cells to enable current flow through (around) unilluminated or damaged cells. Such bypass diodes may be integrated during wafer-level processing of the photodiodes or connected to the array as discrete elements.

In some embodiments, individual photovoltaic cells may include a compound semiconductor and may be formed en masse during wafer-level processing. Alternatively, individual photovoltaic cells may be formed separately and then transferred (e.g., by pick-and-place or wafer bonding) to a carrier substrate.

In some embodiments, the light source and the photovoltaic cell array may be in direct contact. In some embodiments, an optical connector may be disposed between the light source and the photovoltaic cell array to guide emitted light from the light source to the photovoltaic cells within the array. An optical connector may include any material suitable for guiding light, including glass, polymer, and/or semiconductor compositions (e.g., $SiO_2$). The optical connector may include crystalline or amorphous materials, for example. The optical connector may be electrically insulating. To inhibit reflective losses, in certain embodiments, the optical connector may be characterized by a refractive index of at least 1.4.

In some embodiments, the light source may include N emitters and the photovoltaic cell array may include N corresponding photovoltaic cells. In further embodiments, the number of emitters may exceed the number of photovoltaic cells. In still further embodiments, the number of photovoltaic cells may exceed the number of emitters. The optical connector may further include a micro lens array or other elements configured to focus emitted light onto individual photovoltaic cells, e.g., onto a center of respective photovoltaic cells.

Features from any of the embodiments described herein may be used in combination with one another in accordance with the general principles described herein. These and other embodiments, features, and advantages will be more fully understood upon reading the following detailed description in conjunction with the accompanying drawings and claims.

The following will provide, with reference to the drawings, detailed descriptions of optical transformers, i.e., optically-driven voltage converters, as well as devices and systems using such optical transformers. The discussion associated with FIG. 1A include a description of an example optical transformer. The discussion associated with FIGS. 1B-1C and 2A-2E includes a description of various components and configurations of an optical transformer. The discussion associated with FIGS. 3A-3E includes a description of example configurations of a photovoltaic cell array. The discussion associated with FIG. 4 includes a description of an example configuration with an optical transformer and an actuator. The discussion associated with FIGS. 5-10 relates to exemplary virtual reality and augmented reality device architectures that may include an optical transformer as disclosed herein. The discussion associated with FIG. 11 relates to a method of operating an optical transformer.

FIG. 1A shows a perspective view of an example optical transformer in accordance with some embodiments. Optical transformer 100 may include a light source 110 and a photovoltaic cell array 120 facing the light source 110. In certain embodiments, the optical transformer 100 may further include a cooling element (not shown), such as an active cooling element or a passive cooling element adapted to control the temperature during use of one or more of the light source 110 and the photovoltaic cell array 120.

Figure 1B:
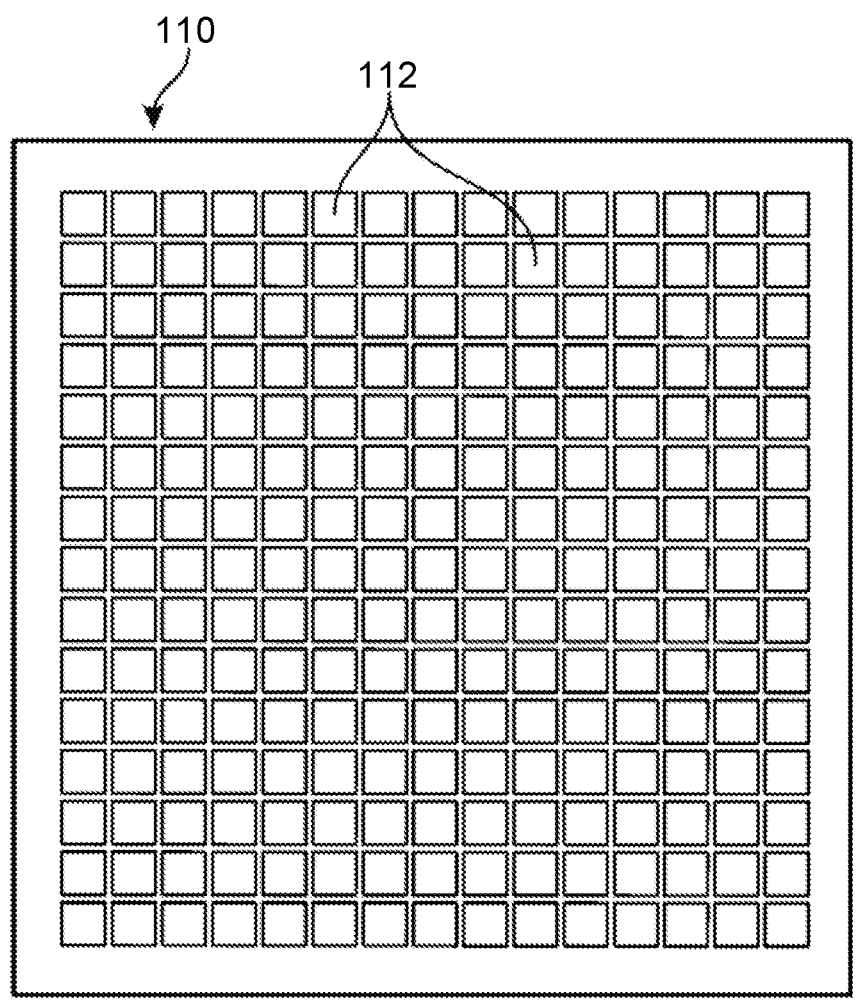
FIG. 1B shows an example arrangement of light emitters in accordance with some embodiments.

The light source 110 includes a plurality of light emitters 112, as shown in FIG. 1B. Alternatively, the light source 110 may include one or more individual emitters coupled with a spatial light modulator.

Referring back to FIG. 1A, the light source 110, including the plurality of light emitters 112, may be coupled with a voltage source 160 through an input electrical connector 140. Although the voltage source 160 is depicted in FIG. 1A, in some embodiments, the voltage source 160 is not part of the optical transformer 100. In some other embodiments, the optical transformer 100 includes the voltage source 160.

In some embodiments, light emitter 112 may include a laser or a light-emitting diode. Example lasers may include a vertical cavity surface emitting laser (VCSEL) or a vertical external cavity surface emitting laser (VECSEL). A light-emitting diode (LED) may include an organic light emitting diode (OLED) or a resonant cavity light emitting diode (RCLED).

An OLED device, for instance, may include, from bottom to top, a glass substrate, a conducting anode such as indium tin oxide (ITO), a stack of organic layers, and a cathode layer. In certain examples, the device may include a transparent anode and a reflective cathode layer such that light generated by the device may be emitted through the substrate, e.g., a bottom-emitting device. In further examples, the OLED device may include a reflective anode and a transparent cathode such that light generated by the device may be emitted through the transparent cathode, e.g., a top-emitting device.

According to some embodiments, light emitter 112 may emit electromagnetic radiation having a wavelength of from approximately 100 nm to approximately 2 µm, e.g., 100 nm, 200 nm, 300 nm, 400 nm, 500 nm, 600 nm, 700 nm, 800 nm, 900 nm, 1 µm, 1.5 µm, or 2 µm, including ranges between any of the foregoing values.

In the illustrated embodiments, the light emitters 112 and the photovoltaic cell array 120 each present a planar geometry. According to further embodiments, either or both of the light emitters 112 and the photovoltaic cell array 120 may include a non-planar surface, such as a convex surface or a concave surface.

According to some embodiments, as disclosed herein, the light emitter 112 may include a laser. For example, the light source 110 may include a vertical-cavity surface-emitting laser (VCSEL) array. The VCSEL array may include a square array of individual emitters that may be connected in parallel or, according to some embodiments, addressed individually. In embodiments where the light emitter 112 includes a laser, the optical transformer may further include an optical insulator unit (not shown) to suppress instabilities associated with the laser.

Figure 1C:
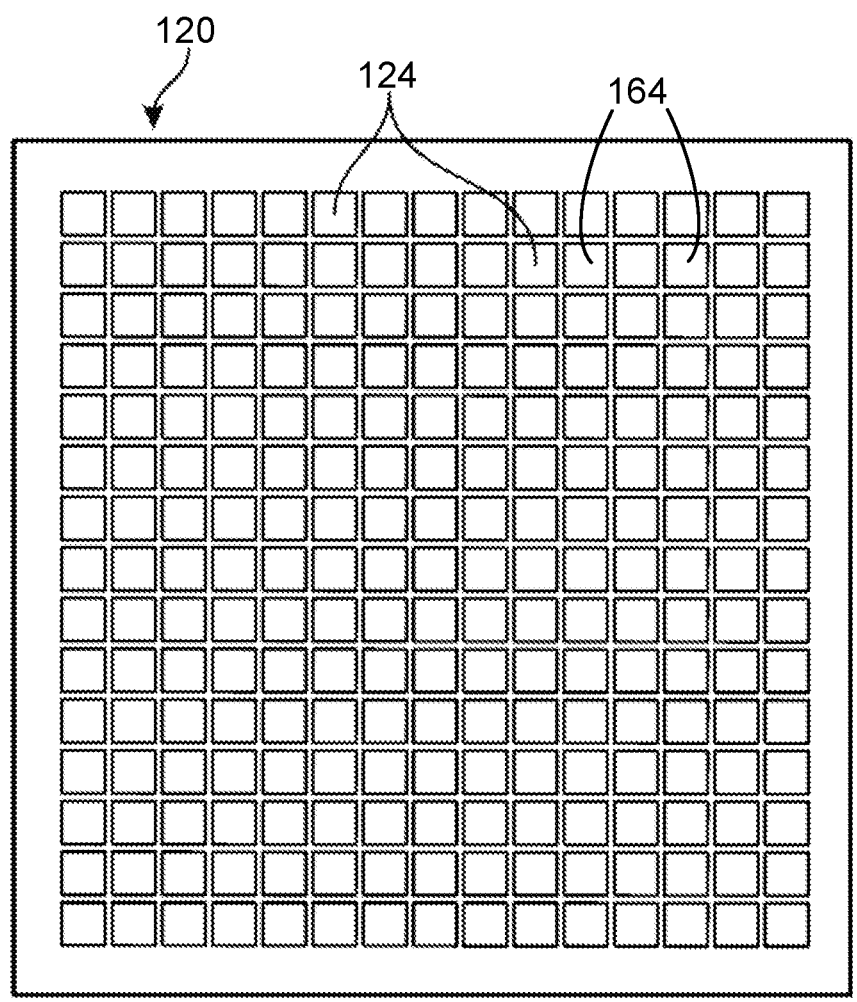
FIG. 1C shows an example arrangement of photovoltaic cells in accordance with some embodiments.

FIG. 1C is a plan view of photovoltaic cell array 120. Photovoltaic cell array 120 may include a plurality of individual photovoltaic elements 124 and one or more optically triggered switches 164. In some embodiments, at least a portion of the photovoltaic elements 124 is interconnected in series. Example photovoltaic cell arrays may include at least approximately 10 photovoltaic cells, e.g., 10, 25, 50, 75, 100, or 200 or more photovoltaic cells, including ranges between any of the foregoing values. As will be appreciated, by arranging at least a portion of the photovoltaic cells 124 in series, the output voltage available from an output electrical connector 150 (shown in FIG. 1A) of the array 120 may be greater than the open circuit voltage of an individual photovoltaic element 124. For instance, the open circuit voltage of an array of N photovoltaic elements interconnected in series may be approximately N times the open circuit voltage of an individual photovoltaic element within the array. In some embodiments, the plurality of photovoltaic cells 124 is arranged in such a way that the output voltage is greater than the input voltage (provided to the input electrical connector 140 shown in FIG. 1A). In some cases, the difference between the input voltage and the output voltage is at least 10, 20, 30, 40, 50, 60, 70, 80, 90, 100, 150, 200, 300, 400, 500, 600, 700, 800, 900, or 1000 V, including ranges between any of the foregoing values. As used herein, the term "open circuit voltage" may, in some examples, refer to the electrical potential difference between two terminals of a device when disconnected from any circuit, e.g., the voltage in the absence of an external load.

In some embodiments, the one or more optically triggered switches 164 are electrically coupled to one or more photovoltaic cells, thereby allowing dynamic reconfiguration among the photovoltaic cells. In some embodiments, a respective optically triggered switch has a unique corresponding light emitter so that the respective optically triggered switch is individually activatable. In some embodiments, two or more optically triggered switches are positioned for illumination by a single light emitter so that the two or more optically triggered switches are activated or deactivated together. In some embodiments, a light emitter is positioned to illuminate both one or more optically triggered switches and one or more photovoltaic cells. In some embodiments, a light emitter is positioned to illuminate only one optically triggered switch and not illuminate any other optically triggered switch or any photovoltaic cell.

Figure 2A:
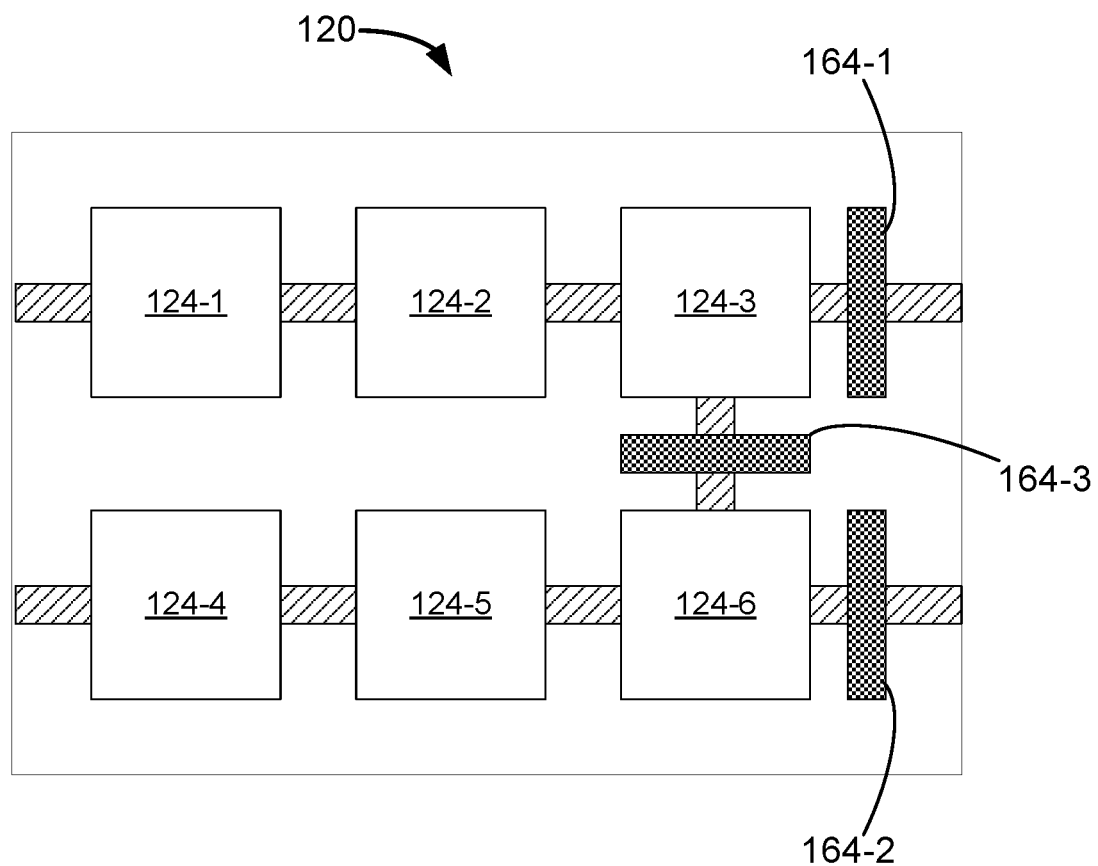
FIG. 2A shows an example arrangement of photovoltaic cells and optically triggered switches in accordance with some embodiments.

FIG. 2A shows an example arrangement of photovoltaic cells and optically triggered switches in accordance with some embodiments.

Photovoltaic cell array 120 shown in FIG. 2A includes a first group of photovoltaic cells 124-1, 124-2, and 124-3 connected in series and a second group of photovoltaic cells 124-4, 124-5, and 124-6 connected in series.

In FIG. 2A, the first and second groups of photovoltaic cells are electrically coupled to optically triggered switches 164-1, 164-2, and 164-3. By illuminating the switches, the network can be dynamically be reprogrammed by connecting several groups of cells in series or in parallel to adjust the resulting output voltage and output current, as described further with respect to FIGS. 3B and 3C.

In some embodiments, an optically triggered switch is in an "on" state while the optically triggered switch is illuminated by light (or illuminated by light satisfying activation criteria, such as the wavelength of the illumination light being within a certain wavelength range and/or the intensity of the illumination light exceeding a certain intensity threshold), and the optically triggered switch is in an "off" state while the optically triggered switch is not illuminated by light (or illuminated by light that does not satisfy the activation criteria). In some embodiments, an optically triggered switch is in the "off" state while the optically triggered switch is illuminated by light (or illuminated by light satisfying the activation criteria), and the optically triggered switch is in the "on" state while the optically triggered switch is not illuminated by light (or illuminated by light that does not satisfy the activation criteria). In some embodiments, the optically triggered switch, while in the "on" state, has a resistance below a predefined resistance threshold, thereby allowing electrical conduction through the optically triggered switch, and the optically triggered switch, while in the "off" state, has a resistance above the predefined resistance threshold, thereby preventing or reducing the electrical conduction through the optically triggered switch.

FIGS. 2B-2E are schematic diagrams illustrating structures and operations of optically triggered switches in accordance with some embodiments.

Figure 2B:
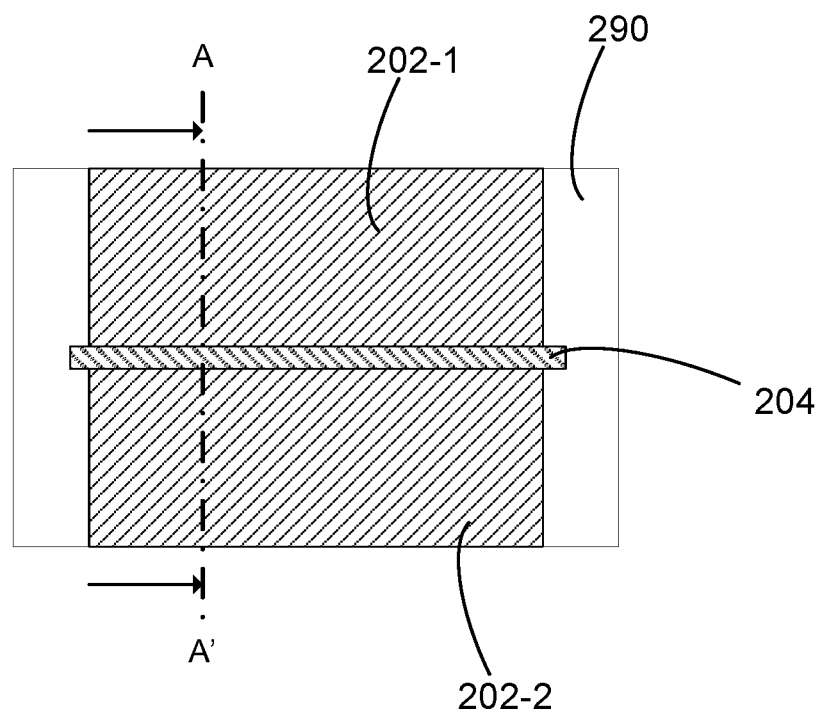
FIGS. 2B-2E are schematic diagrams illustrating optically triggered switches in accordance with some embodiments.

FIG. 2B is a schematic diagram illustrating a plan view of an optical switch in accordance with some embodiments. In FIG. 2B, electrodes 202-1 and 202-2 are positioned (e.g., deposited) on a substrate 290 (e.g., a semiconductor substrate). Electrodes 202-1 and 202-2 are separated from each other to define a gap 204. When the gap 204 is illuminated with light, photocarriers are generated, which allows current flow between electrodes 202-1 and 202-2.

Figure 2C:
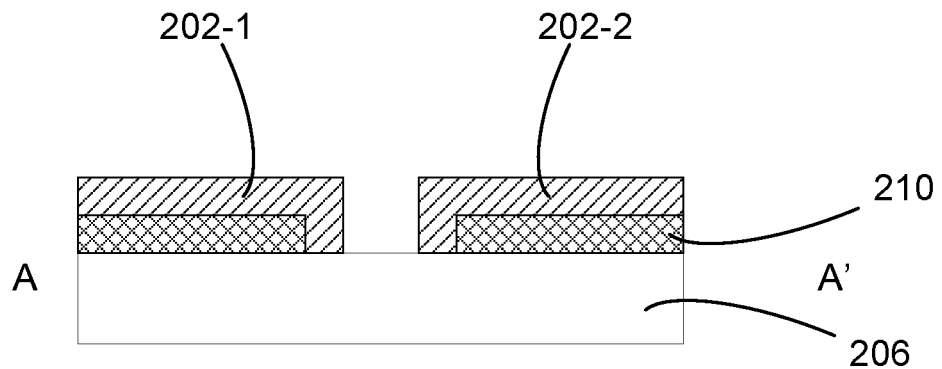
Figure 2D:
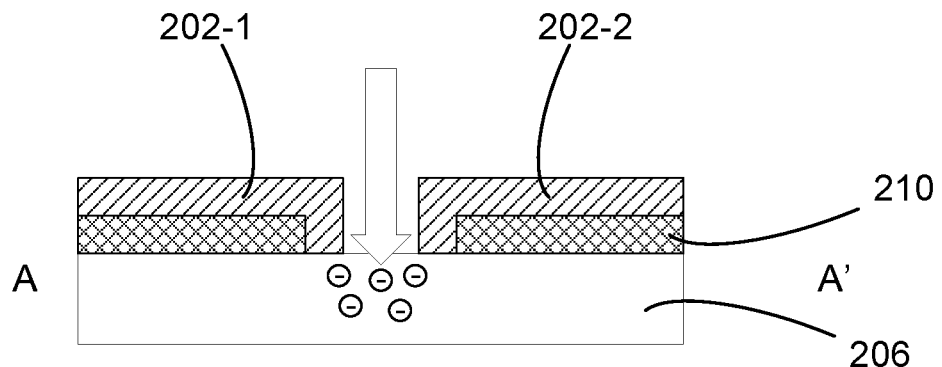
Figure 2E:
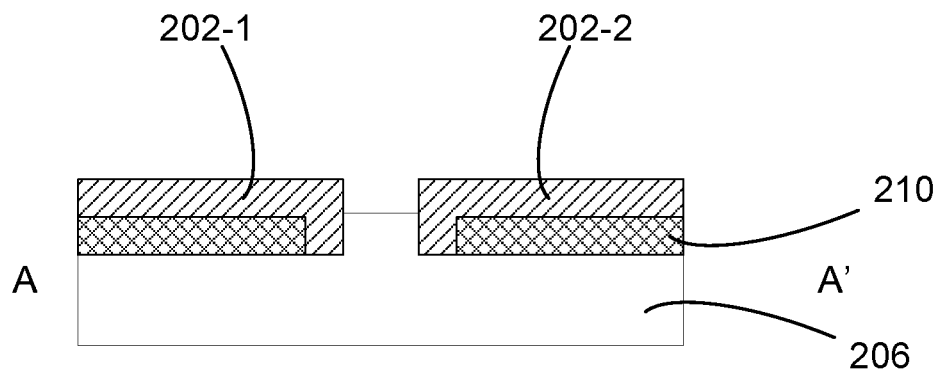

FIG. 2B also shows line AA', which indicates the section from which the cross-sectional views shown in FIGS. 2C-2E are taken.

FIGS. 2C and 2D are schematic diagrams illustrating the cross-sectional view of the optically triggered switch shown in FIG. 2B in accordance with some embodiments.

In FIGS. 2C and 2D, the optically triggered switch includes a layer 206 of photoconductive material (e.g., with high intrinsic resistivity). In some embodiments, a semiconductor layer 210 (e.g., semiconductor material used for forming photovoltaic cells) is positioned over the layer 206. Electrodes 202-1 and 202-2 (e.g., made of metal or other conductive material) are positioned over the layer 206 (and over the layer 210, if the layer 210 is present) so that electrodes 202-1 and 202-2 are in contact with the layer 206 while electrodes 202-1 and 202-2 are separated from each other.

As shown in FIG. 2C, when no light illuminates the layer 206 of photoconductive material (or when light illuminating the layer 206 of photoconductive material does not satisfy certain activation criteria, such as intensity of the light), due to the high resistivity of the photoconductive material, no electrical current is transmitted between electrode 202-1 and electrode 202-2.

As shown in FIG. 2D, when light (e.g., light satisfying the activation criteria) illuminates the layer 206 of photoconductive material (e.g., in particular, the region adjacent to the gap between electrodes 202-1 and 202-2), free carriers are generates, which enables electrical current to flow between electrode 202-1 and electrode 202-2.

FIG. 2E is a schematic diagram illustrating the cross-sectional view of the optically triggered switch shown in FIG. 2B in accordance with some embodiments. FIG. 2E is similar to FIG. 2C except that at least a portion of the photoconductive material is located between electrodes 202-1 and 202-2.

Figure 3A:
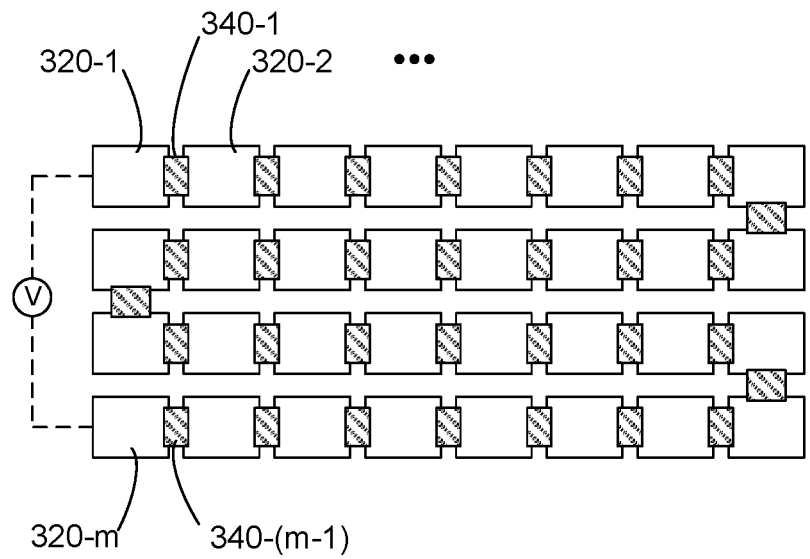
FIG. 3A is a schematic diagram illustrating an array of photovoltaic cells arranged in series according to some embodiments.

FIG. 3A is a schematic diagram illustrating an array of photovoltaic cells 320 (e.g., 320-1 through 320-$m$, which correspond to photovoltaic cells 124 shown in FIGS. 1A and 1C) arranged in series according to some embodiments. For example, a respective photovoltaic cell is electrically coupled to an adjacent photovoltaic cell via an electrical connector (e.g., photovoltaic cell 320-1 is electrically coupled with photovoltaic cell 320-2 via electrical connector 340-1). The serially connected photovoltaic cells may be arranged in a two-dimensional array (as shown in FIG. 3A) or in a three-dimensional array. For example, in FIG. 3A, the photovoltaic cells 320 are arranged in rows and columns. In some embodiments, the photovoltaic cells 320 are arranged laterally (e.g., the photovoltaic cells 320 are arranged on a single horizontal layer substantially parallel to a surface of a substrate), vertically (e.g., the photovoltaic cells 320 are arranged on a single vertical layer substantially perpendicular to a surface of a substrate), or in a combination of vertical and lateral connections (e.g., forming a three-dimensional array). The voltage difference provided by the array of photovoltaic cells 320 (e.g., the voltage difference between the photovoltaic cell 320-1 and the photovoltaic cell 320-m) is significantly higher than a voltage difference provided by a single photovoltaic cell. This allows the array of photovoltaic cells 320 to provide an electrical output voltage that is greater than an electrical input voltage applied to the optical transformer.

Figure 3B:
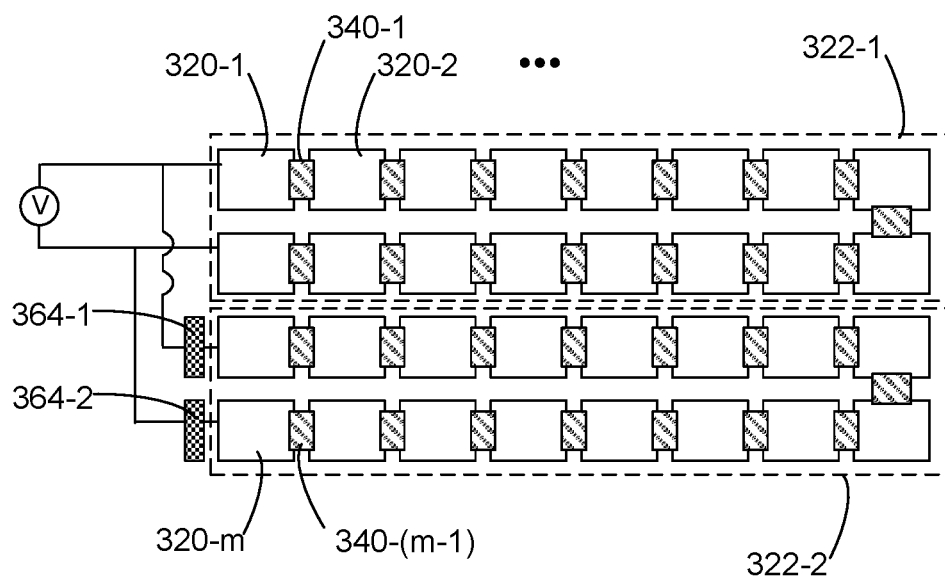
FIG. 3B is a schematic diagram illustrating an array of photovoltaic cells arranged to dynamically adjust an output current in accordance with some embodiments.

FIG. 3B is a schematic diagram illustrating an array of photovoltaic cells arranged to dynamically adjust an output current in accordance with some embodiments.

In FIG. 3B, the photovoltaic cells are divided into at least a first group 322-1 of photovoltaic cells and a second group 322-2 of photovoltaic cells. The photovoltaic cells in the first group 322-1 are electrically connected in series, and the photovoltaic cells in the second group 322-1 are electrically connected in series. In addition, the first group 322-1 and the second group 322-2 of photovoltaic cells are connected in parallel through optically triggered switches 364-1 and 364-2.

While optically triggered switches 364-1 and 364-2 are in the "off" state, an electrical current provided by the first group 322-1 of photovoltaic cells is output from the optical transformer (e.g., an electrical current provided by the second group 322-2 of photovoltaic cells, if any, is not output from the optical transformer). In some embodiments, while optically triggered switches 364-1 and 364-2 are in the "off" state, the second group 322-2 of photovoltaic cells is not illuminated (e.g., light emitters corresponding to the photovoltaic cells in the second group 322-2 are turned off). While optically triggered switches 364-1 and 364-2 are in the "off" state, an electrical current provided by both the first group 322-1 of photovoltaic cells and the second group 322-2 of photovoltaic cells is output from the optical transformer, thereby increasing (e.g., doubling) the output current. Thus, the output current of the optical transformer may be dynamically adjusted by switching on or off optically triggered switches 364-1 and 364-2.

Although FIG. 3B shows that the photovoltaic cells are divided into two groups, in some embodiments, the photovoltaic cells are divided into three or more groups. In addition, although FIG. 3B shows that the first group 322-1 and the second group 322-2 have a same number of photovoltaic cells, in some embodiments, the first group 322-1 and the second group 322-2 have different numbers of photovoltaic cells.

Figure 3C:
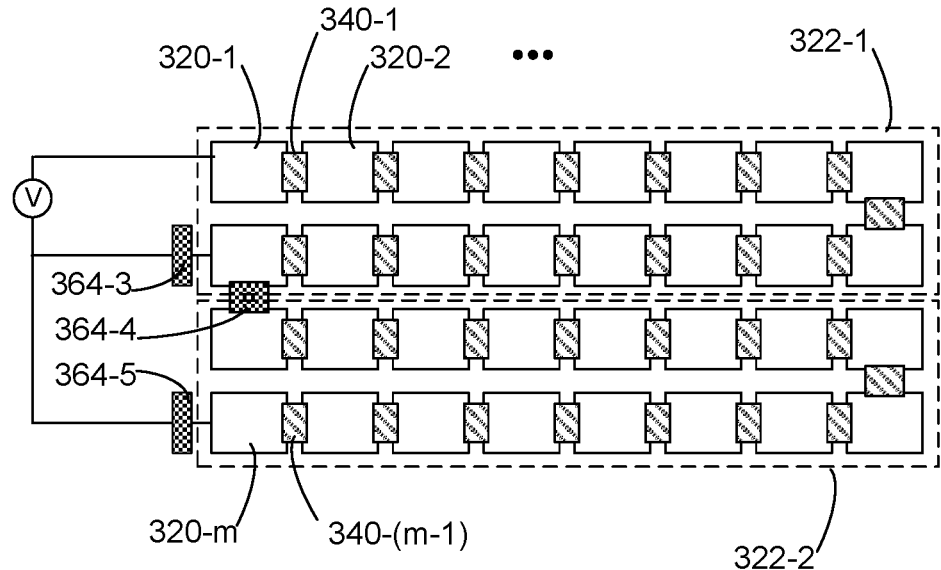
FIG. 3C is a schematic diagram illustrating an array of photovoltaic cells arranged to dynamically adjust an output voltage in accordance with some embodiments.

FIG. 3C is a schematic diagram illustrating an array of photovoltaic cells arranged to dynamically adjust an output voltage in accordance with some embodiments.

In FIG. 3C, the photovoltaic cells are divided into at least a first group 322-1 of photovoltaic cells and a second group 322-2 of photovoltaic cells. The photovoltaic cells in the first group 322-1 are electrically connected in series, and the photovoltaic cells in the second group 322-1 are electrically connected in series. The first group 322-1 of photovoltaic cells is electrically coupled to an output of the optical transformer at least partly via optically triggered switch 364-3. In addition, the first group 322-1 and the second group 322-2 of photovoltaic cells are connected in series through optically triggered switch 364-4. The second group 322-2 of photovoltaic cells is electrically coupled to the output of the optical transformer at least partly via optically triggered switch 364-5.

While optically triggered switch 364-3 is in the "on" state and optically triggered switch 364-4 is in the "off" state (and optionally, optically triggered switch 364-5 is in the "off" state), a voltage provided by the first group 322-1 of photovoltaic cells is output from the optical transformer (e.g., a voltage provided by the second group 322-2 of photovoltaic cells, if any, is not output from the optical transformer). In some embodiments, while optically triggered switch 364-4 is in the "off" state, the second group 322-2 of photovoltaic cells is not illuminated (e.g., light emitters corresponding to the photovoltaic cells in the second group 322-2 are turned off). While optically triggered switches 364-4 and 364-5 are in the "on" state and optically triggered switch 364-3 is in the "off" state, a sum of the voltages provided by both the first group 322-1 of photovoltaic cells and the second group 322-2 of photovoltaic cells is output from the optical transformer, thereby increasing (e.g., doubling) the output voltage. Thus, the output voltage of the optical transformer may be dynamically adjusted by switching on or off optically triggered switches 364-3, 364-4, and 364-5.

Although FIG. 3C shows that the photovoltaic cells are divided into two groups, in some embodiments, the photovoltaic cells are divided into three or more groups. In addition, although FIG. 3C shows that the first group 322-1 and the second group 322-2 have a same number of photovoltaic cells, in some embodiments, the first group 322-1 and the second group 322-2 have different numbers of photovoltaic cells.

Figure 3D:
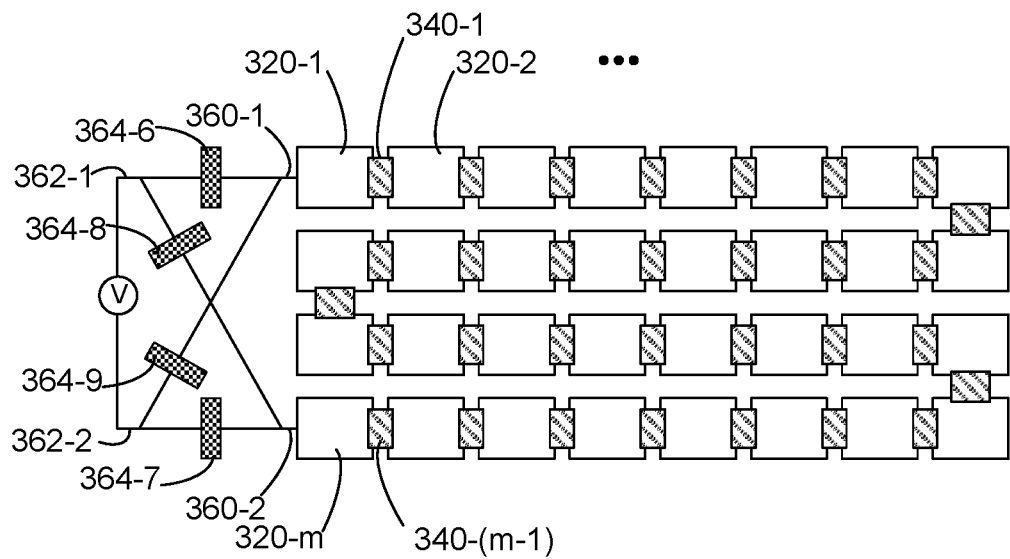
FIG. 3D is a schematic diagram illustrating an array of photovoltaic cells coupled with an example reverse polarity circuit in accordance with some embodiments.

FIG. 3D is a schematic diagram illustrating an array of photovoltaic cells coupled with an example reverse polarity circuit in accordance with some embodiments.

In FIG. 3D, the reverse polarity circuit includes optically triggered switches 364-6, 364-7, 364-8, and 364-9. Optically triggered switch 364-6 is electrically coupled to the first input channel 360-1 and the first output channel 362-1, optically triggered switch 364-9 is electrically coupled to the first input channel 360-1 and the second output channel 362-2, optically triggered switch 364-8 is electrically coupled to the second input channel 360-2 and the first output channel 362-1, and optically triggered switch 364-7 is electrically coupled to the second input channel 360-2 and the second output channel 362-2.

While optically triggered switches 364-6 and 364-7 are in the "on" state and optically triggered switches 364-8 and 364-9 are in the "off" state, the reverse polarity circuit does not reverse polarity (e.g., a polarity of the voltage between the first input channel 360-1 and the second input channel 360-2 is maintained for the voltage between the first output channel 362-1 and the second output channel 362-2). While optically triggered switches 364-6 and 364-7 are in the "off" state and optically triggered switches 364-8 and 364-9 are in the "on" state, the reverse polarity circuit changes polarity of the output voltage (e.g., the polarity of the voltage between the first input channel 360-1 and the second input channel 360-2 is opposite to the polarity between the first output channel 362-1 and the second output channel 362-2).

Figure 3E:
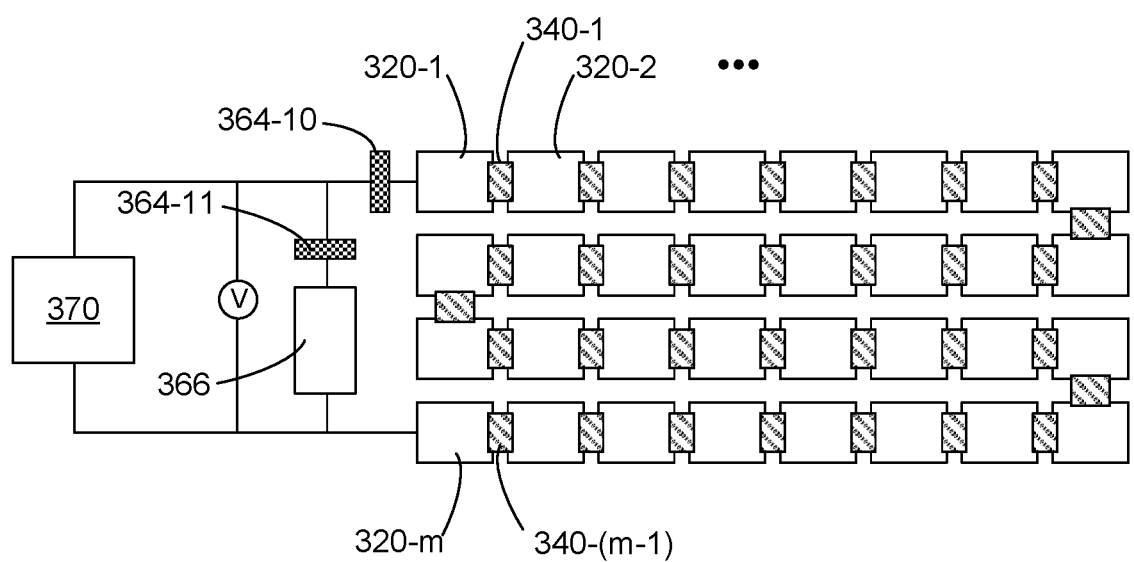
FIG. 3E is a schematic diagram illustrating an array of photovoltaic cells coupled with a switchable drain circuit in accordance with some embodiments.

FIG. 3E is a schematic diagram illustrating an array of photovoltaic cells coupled with a switchable drain circuit in accordance with some embodiments.

In FIG. 3E, the plurality of photovoltaic cells is electrically coupled to load 370 through optically triggered switch 364-10. The drain circuit 366 (or a drain channel) is also electrically coupled to load 370.

While optically triggered switch 364-10 is in the "on" state and optically triggered switch 364-11 is in the "off" state, electricity is provided from the plurality of photovoltaic cells to the load 370. While optically triggered switch 364-10 is in the "off" state and optically triggered switch 364-11 is in the "on" state, the electricity in the load 370 is discharged through the drain circuit 366.

Figure 4:
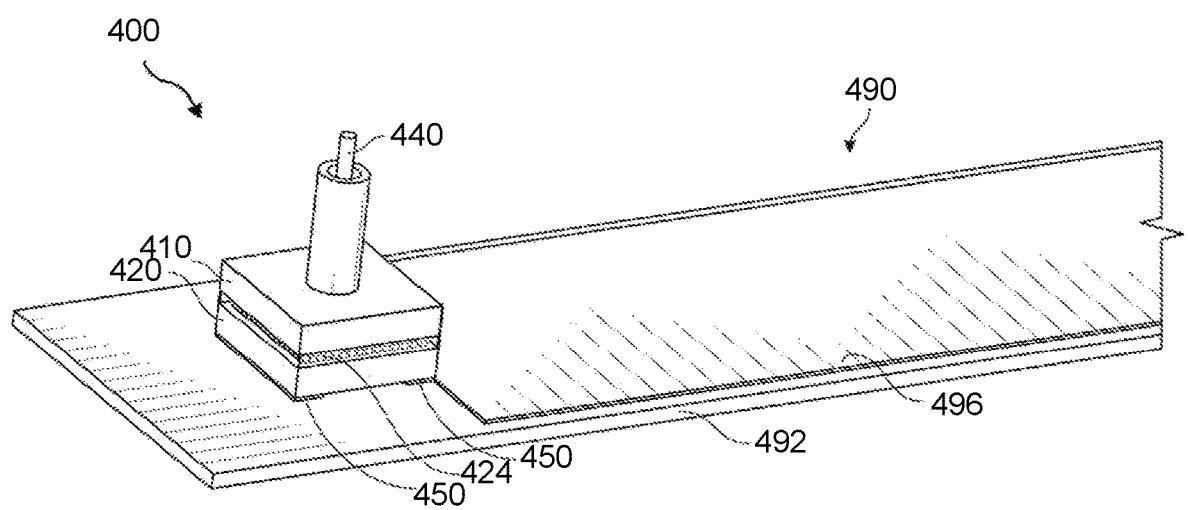
FIG. 4 shows an example actuator integrated with an optical transformer in accordance with certain embodiments.

The optical transformers disclosed herein may be incorporated into a variety of devices and systems. An example device may include an actuator, such as a piezoelectric actuator or an electroactive actuator. FIG. 4 shows an example optical transformer integrated with a bender beam actuator. Optical transformer 400 includes a light source 410 and a photovoltaic cell array 420 facing the light source 410.

Light source 410 may include an array of individual emitters (not shown) and may be powered with a voltage source coupled through an input electrical connector 440. As disclosed herein, light source 410 may include a laser or a light-emitting diode. Photovoltaic cell array 420 may include a plurality of photovoltaic cells 424. At least a portion of the photovoltaic cells 424 may be electrically connected in series. Optical transformer 400 may further include a high voltage output through electrical output electrodes 450.

Optical transformer 400 may be mounted directly on actuator 490, which may include an electroactive layer 492 disposed between a primary (overlying) electrode 496 and a secondary (underlying) electrode (not shown). In certain embodiments, optical transformer 400 may be mounted directly on the electroactive layer 492, which may advantageously obviate the need for high voltage wiring and enable the realization of a compact architecture. The electroactive layer 492 may include a ceramic or other dielectric material, for example, and the electrodes may each include one or more layers of any suitable conductive material(s), such as transparent conductive oxides (e.g., TCOs such as indium tin oxide (ITO)), graphene, etc. Electrical output electrodes 450 may be connected to primary electrode 496, for example.

Thus, according to some embodiments, an actuation system may include (i) an optical transformer having a light source and a serial array of photovoltaic cells optically coupled to the light source, and (ii) an actuator having a primary electrode, a secondary electrode overlapping at least a portion of the primary electrode, and an electroactive layer disposed between and abutting the primary electrode and the secondary electrode, where the primary electrode is electrically connected to an output of the optical transformer.

According to certain embodiments, actuator 490 may include a unimorph or a bimorph construction. A "unimorph" construction may, in some examples, refer to a device having a single electroactive layer sandwiched between paired electrodes. A "bimorph" construction may, in some examples, refer to a device including two electroactive layers each sandwiched between opposing electrodes. According to certain embodiments, actuator 490 may have a length and a width that are selected independently from approximately 5 mm to approximately 50 mm, e.g., 5, 10, 15, 20, 25, 30, 35, 40, 45, or 50 mm, including ranges between any of the foregoing values.

As used herein, "electroactive layer" or "electroactive ceramic" may, in some examples, refer to materials that exhibit a change in size or shape when stimulated by an electric field. In the presence of an electrostatic field (E-field), an electroactive material may deform (e.g., compress, elongate, bend, etc.) according to the magnitude and direction of the applied field. Generation of such a field may be accomplished by placing the electroactive material between two electrodes, e.g., a primary electrode and a secondary electrode, each of which is at a different potential. As the potential difference (i.e., voltage difference) between the electrodes is increased (e.g., from zero potential) the amount of deformation may also increase, principally along electric field lines. This deformation may achieve saturation when a certain electrostatic field strength has been reached. With no electrostatic field, the electroactive material may be in its relaxed state undergoing no induced deformation, or stated equivalently, no induced strain, either internal or external.

Example electroactive ceramics may include one or more electroactive, piezoelectric, antiferroelectric, relaxor, or ferroelectric ceramics, such as perovskite ceramics, including lead titanate, lead zirconate, lead zirconate titanate (PZT), lead magnesium niobate, lead zinc niobate, lead indium niobate, lead magnesium tantalate, lead magnesium niobate-lead titanate (PMT-PT), lead zinc niobate-lead titanate (PZN-PT), lead indium tantalate, barium titanate, lithium niobate, potassium niobate, sodium potassium niobate, bismuth sodium titanate, and bismuth ferrite, as well as solid solutions or mixtures thereof. Example non-perovskite piezoelectric ceramics include quartz and gallium nitride. According to some embodiments, an electroactive ceramic may be doped with one or more dopants selected from calcium, lanthanum, europium, neodymium, scandium, and erbium. According to some embodiments, an electroactive material may include a dielectric material. Example dielectric compositions may have a composite (i.e., multi-phase) architecture that may include a liquid or gaseous material dispersed throughout a solid matrix.

In certain embodiments, the electroactive ceramics disclosed herein may be perovskite ceramics and may be substantially free of secondary phases, i.e., may contain less than approximately 2% by volume of any secondary phase, including porosity, e.g., less than 2%, less than 1%, less than 0.5%, less than 0.2%, or less than 0.1%, including ranges between any of the foregoing values. Further example secondary phases may include pyrochlores, which may adversely impact the material's piezoelectric response. In certain embodiments, the disclosed electroactive ceramics may be birefringent, which may be attributable to the material including plural distinct domains or regions of varying polarization having different refractive indices, such that the refractive index experienced by light passing through the material may be a function of the propagation direction of the light as well as its polarization.

Ceramic electroactive materials, such as single crystal piezoelectric materials, may be formed, for example, using hydrothermal processing or by a Czochralski method to produce an oriented ingot, which may be cut along a specified crystal plane to produce wafers having a desired crystalline orientation. Further methods for forming single crystals include float zone, Bridgman, Stockbarger, chemical vapor deposition, physical vapor transport, solvothermal techniques, etc. A wafer may be thinned, e.g., via lapping or grinding, and/or polished, and transparent electrodes may be formed directly on the wafer, e.g., using chemical vapor deposition or a physical vapor deposition process such as sputtering or evaporation.

In addition to the foregoing, polycrystalline piezoelectric materials may be formed, e.g., by powder processing. Densely-packed networks of high purity, ultrafine polycrystalline particles can be highly transparent and may be more mechanically robust in thin layers than their single crystal counterparts. For instance, optical grade lanthanum-doped lead zirconate titanate (PLZT) having >99.9% purity may be formed using sub-micron (e.g., <2 μm) particles. In this regard, substitution via doping of $Pb^{2+}$ at A and B-site vacancies with $La^{2+}$ and/or $Ba^{2+}$ may be used to increase the transparency of perovskite ceramics such as PZN-PT, PZT and PMN-PT.

According to some embodiments, ultrafine particle precursors can be fabricated via wet chemical methods, such as chemical co-precipitation, sol-gel and gel combustion. Green bodies may be formed using tape casting, slip casting, or gel casting. High pressure and high temperature sintering using techniques such as hot pressing, high pressure (HP) and hot isostatic pressure, spark plasma sintering, and microwave sintering, for example, may be used to improve the ceramic particle packing density. Thinning via lapping, grinding and/or polishing may be used to decrease surface roughness to achieve thin, highly optically transparent layers that are suitable for high displacement actuation. As measured by atomic force microscopy (AFM) or interferometry, an electroactive ceramic may have an RMS surface roughness of less than approximately 5 nm, e.g., approximately 1, 2, or 5 nm, including ranges between any of the foregoing values.

The electroactive ceramic may be poled to achieve a desired dipole alignment. As used herein, "poling" to form a "poled" material may, in some examples, refer to a process whereby an electric field is applied to an electroactive ceramic. The effect of poling may include an alignment of the various domains within the material to produce a net polarization in the direction of the applied field.

Ceramics having a preferred crystallographic orientation (i.e., texture) may be formed by various methods, including electrophoresis, slip casting, electric field alignment, magnetic field alignment, high pressure sintering, uniaxial pressing, temperature gradients, spark plasma sintering, directional solidification, templated grain growth, rolling, and shear alignment.

In some embodiments, an actuator may include paired electrodes, which allow the creation of the electrostatic field that forces constriction of the electroactive layer. In some embodiments, an "electrode," as used herein, may refer to an electrically conductive material, which may be in the form of a thin film or a layer. Electrodes may include relatively thin, electrically conductive metals or metal alloys and may be of a non-compliant or compliant nature.

An electrode may include one or more electrically conductive materials, such as a metal, a semiconductor (e.g., a doped semiconductor), carbon nanotubes, graphene, oxidized graphene, fluorinated graphene, hydrogenated graphene, other graphene derivatives, carbon black, transparent conductive oxides (TCOs, e.g., indium tin oxide (ITO), zinc oxide (ZnO), etc.), or other electrically conducting materials. In some embodiments, the electrodes may include a metal such as aluminum, gold, silver, platinum, palladium, nickel, tantalum, tin, copper, indium, gallium, zinc, alloys thereof, and the like. Further example transparent conductive oxides include, without limitation, aluminum-doped zinc oxide, fluorine-doped tin oxide, indium-doped cadmium oxide, indium zinc oxide, indium gallium tin oxide, indium gallium zinc tin oxide, strontium vanadate, strontium niobate, strontium molybdate, calcium molybdate, and indium zinc tin oxide.

In some embodiments, the electrode or electrode layer may be self-healing, such that damage from local shorting of a circuit can be isolated. Suitable self-healing electrodes may include thin films of materials which deform or oxidize irreversibly upon Joule heating, such as, for example, aluminum.

In some embodiments, a primary electrode may overlap (e.g., overlap in a parallel direction) at least a portion of a secondary electrode. The primary and secondary electrodes may be generally parallel and spaced apart and separated by a layer of electroactive material.

In some embodiments, the electrodes described herein (e.g., the primary electrode, the secondary electrode, or any other electrode including any common electrode) may be fabricated using any suitable process. For example, the electrodes may be fabricated using physical vapor deposition (PVD), chemical vapor deposition (CVD), atomic layer deposition (ALD), evaporation, spray-coating, spin-coating, dip-coating, screen printing, Gravure printing, ink jet printing, aerosol jet printing, doctor blading, and the like. In further aspects, the electrodes may be manufactured using a thermal evaporator, a sputtering system, stamping, and the like.

In some embodiments, a layer of electroactive material may be deposited directly on to an electrode. In some embodiments, an electrode layer may be deposited directly on to the electroactive material. In some embodiments, electrodes may be prefabricated and attached to an electroactive material. In some embodiments, an electrode may be deposited on a substrate, for example a glass substrate or flexible polymer film. In some embodiments, the electroactive material layer may directly abut an electrode. In some embodiments, there may be an insulating layer, such as a dielectric layer, between a layer of electroactive material and an electrode.

The electrodes may be used to affect large scale deformation, i.e., via full-area coverage, or the electrodes may be patterned to provide spatially localized stress/strain profiles. In particular embodiments, a deformable optical element and an electroactive layer may be co-integrated whereby the deformable optic may itself be actuatable. In addition, various methods of forming optical elements are disclosed, including solution-based and solid-state deposition techniques.

As disclosed herein, an optical transformer having a commercially-relevant form factor may be configured to convert a low (~1-2V) DC input voltage to a high (>1 kV) DC output voltage. The optical transformer may include a light source optically coupled to an array of photovoltaic cells. The light source may be a surface-emitting device or an edge-emitting device and may include a laser or a light emitting diode, for example. The photovoltaic cells, which are at least partially connected in series, may include a direct band gap semiconductor such as GaAs or InGaAs. Photons produced by the DC-powered light source may be directed via an optically transparent intermediate layer to the photovoltaic cells to produce electrical carriers that generate a high electrical voltage across the array.

In certain embodiments, areal dimensions of the individual photovoltaic cells may range from approximately 1 µm×1 µm to approximately 250 µm×250 µm. In certain embodiments, the photovoltaic cells may be illuminated selectively to control the output voltage. That is, the light source may include an addressable array of emitters that can be switched on or off to illuminate a given number of photovoltaic cells.

Voltage or current modulation may be used to control the optical power generated by the light source 110 and accordingly adjust the output voltage. According to some embodiments, the optical transformer may be integrated into a variety of high voltage systems or devices, including a piezoelectric or electrostatic actuator.

Embodiments of the present disclosure may include or be implemented in conjunction with various types of artificial-reality systems. For example, an artificial-reality system (examples of which are shown in FIGS. 5-10) may include one or more optical transformers to power various electrical components (e.g., actuators, high impedance devices, electrostatic devices, haptic devices, etc.) that require a high-voltage electrical input.

Artificial reality is a form of reality that has been adjusted in some manner before presentation to a user, which may include, e.g., a virtual reality, an augmented reality, a mixed reality, a hybrid reality, or some combination and/or derivative thereof. Artificial-reality content may include completely generated content or generated content combined with captured (e.g., real-world) content. The artificial-reality content may include video, audio, haptic feedback, or some combination thereof, any of which may be presented in a single channel or in multiple channels (such as stereo video that produces a three-dimensional (3D) effect to the viewer). Additionally, in some embodiments, artificial reality may also be associated with applications, products, accessories, services, or some combination thereof, that are used to, e.g., create content in an artificial reality and/or are otherwise used in (e.g., to perform activities in) an artificial reality.

Artificial-reality systems may be implemented in a variety of different form factors and configurations. Some artificial-reality systems may be designed to work without near-eye displays (NEDs), an example of which is augmented-reality system 500 in FIG. 5. Other artificial-reality systems may include an NED that also provides visibility into the real world (e.g., augmented-reality system 600 in FIG. 6) or that visually immerses a user in an artificial reality (e.g., virtual-reality system 700 in FIG. 7). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 5:
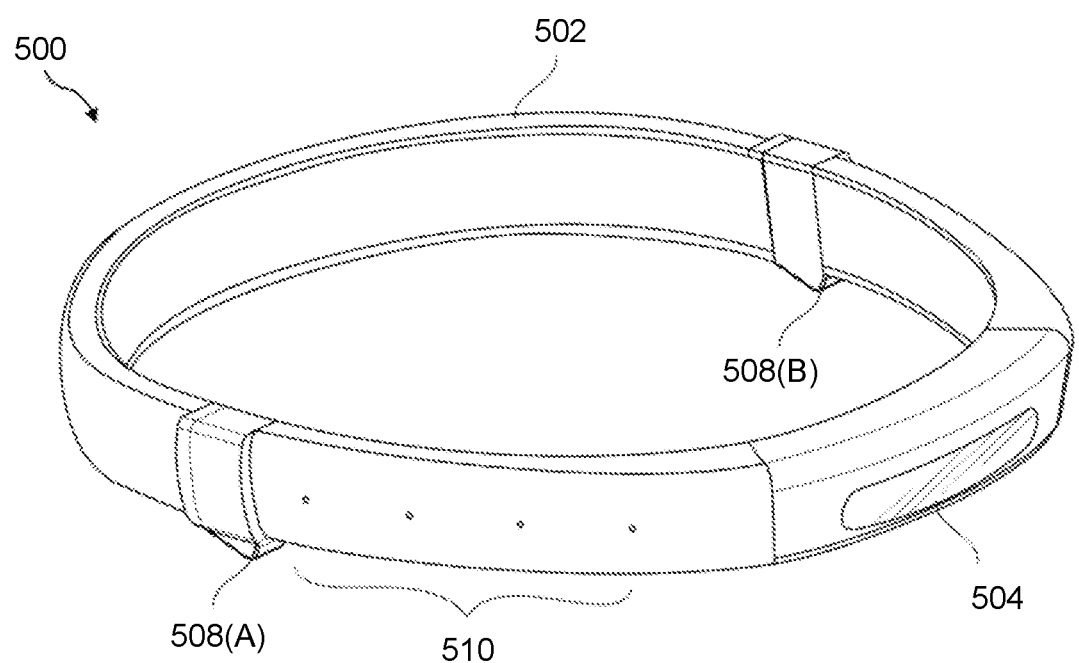
FIG. 5 is an illustration of an exemplary artificial-reality headband that may be used in connection with embodiments of this disclosure.

Turning to FIG. 5, augmented-reality system 500 generally represents a wearable device dimensioned to fit about a body part (e.g., a head) of a user. As shown in FIG. 5, system 500 may include a frame 502 and a camera assembly 504 that is coupled to frame 502 and configured to gather information about a local environment by observing the local environment. Augmented-reality system 500 may also include one or more audio devices, such as output audio transducers 508(A) and 508(B) and input audio transducers 510. Output audio transducers 508(A) and 508(B) may provide audio feedback and/or content to a user, and input audio transducers 510 may capture audio in a user's environment.

As shown, augmented-reality system 500 may not necessarily include an NED positioned in front of a user's eyes. Augmented-reality systems without NEDs may take a variety of forms, such as head bands, hats, hair bands, belts, watches, wrist bands, ankle bands, rings, neckbands, necklaces, chest bands, eyewear frames, and/or any other suitable type or form of apparatus. While augmented-reality system 500 may not include an NED, augmented-reality system 500 may include other types of screens or visual feedback devices (e.g., a display screen integrated into a side of frame 502).

Figure 6:
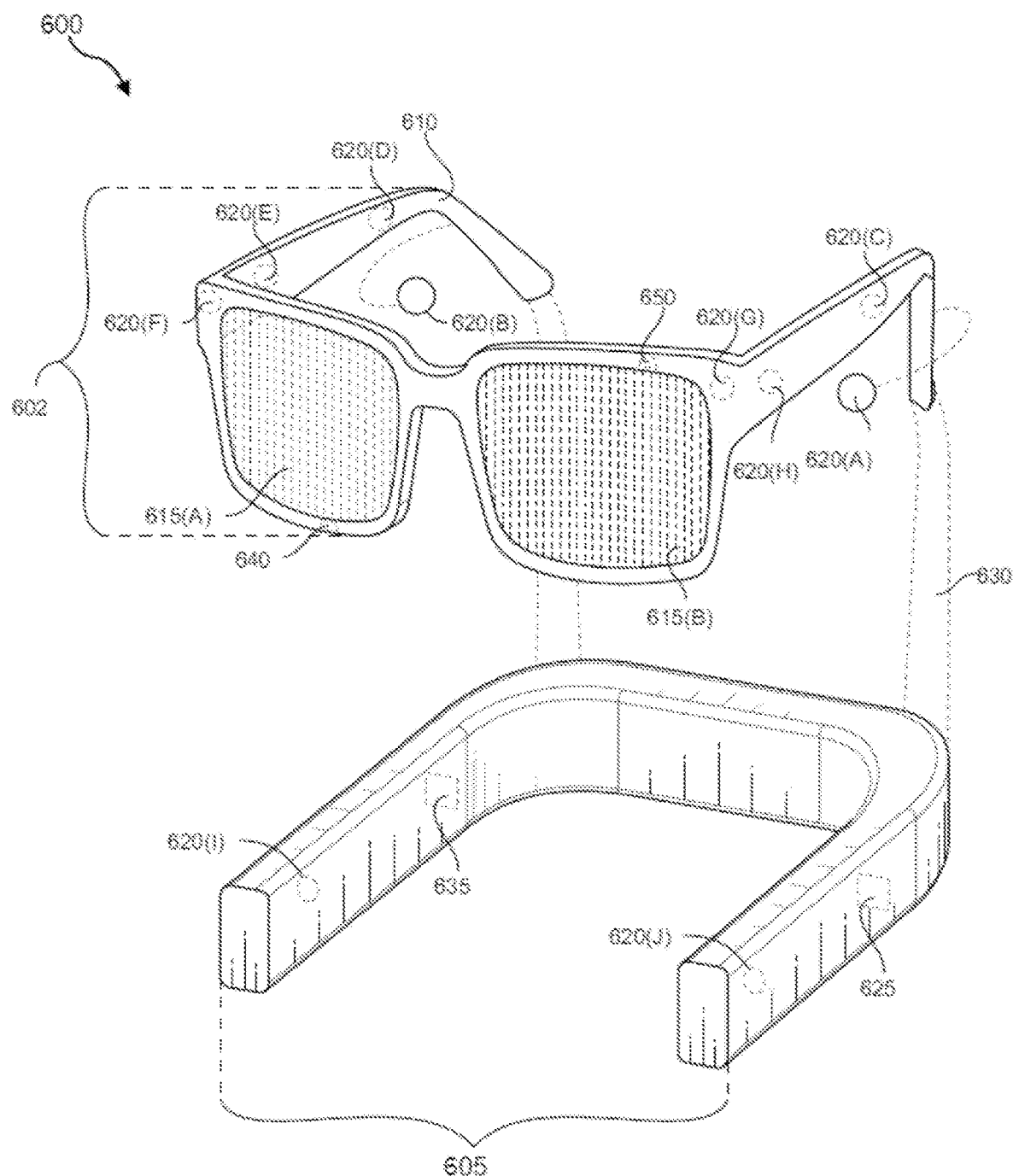
FIG. 6 is an illustration of exemplary augmented-reality glasses that may be used in connection with embodiments of this disclosure.

The embodiments discussed in this disclosure may also be implemented in augmented-reality systems that include one or more NEDs. For example, as shown in FIG. 6, augmented-reality system 600 may include an eyewear device 602 with a frame 610 configured to hold a left display device 615(A) and a right display device 615(B) in front of a user's eyes. Display devices 615(A) and 615(B) may act together or independently to present an image or series of images to a user. While augmented-reality system 600 includes two displays, embodiments of this disclosure may be implemented in augmented-reality systems with a single NED or more than two NEDs.

In some embodiments, augmented-reality system 600 may include one or more sensors, such as sensor 640. Sensor 640 may generate measurement signals in response to motion of augmented-reality system 600 and may be located on substantially any portion of frame 610. Sensor 640 may represent a position sensor, an inertial measurement unit (IMU), a depth camera assembly, or any combination thereof. In some embodiments, augmented-reality system 600 may or may not include sensor 640 or may include more than one sensor. In embodiments in which sensor 640 includes an IMU, the IMU may generate calibration data based on measurement signals from sensor 640. Examples of sensor 640 may include, without limitation, accelerometers, gyroscopes, magnetometers, other suitable types of sensors that detect motion, sensors used for error correction of the IMU, or some combination thereof.

Augmented-reality system 600 may also include a microphone array with a plurality of acoustic transducers 620(A)-620(J), referred to collectively as acoustic transducers 620. Acoustic transducers 620 may be transducers that detect air pressure variations induced by sound waves. Each acoustic transducer 620 may be configured to detect sound and convert the detected sound into an electronic format (e.g., an analog or digital format). The microphone array in FIG. 2 may include, for example, ten acoustic transducers: 620(A) and 620(B), which may be designed to be placed inside a corresponding ear of the user, acoustic transducers 620(C), 620(D), 620(E), 620(F), 620(G), and 620(H), which may be positioned at various locations on frame 610, and/or acoustic transducers 620(I) and 620(J), which may be positioned on a corresponding neckband 605.

In some embodiments, one or more of acoustic transducers 620(A)-(F) may be used as output transducers (e.g., speakers). For example, acoustic transducers 620(A) and/or 620(B) may be earbuds or any other suitable type of headphone or speaker.

The configuration of acoustic transducers 620 of the microphone array may vary. While augmented-reality system 600 is shown in FIG. 6 as having ten acoustic transducers 620, the number of acoustic transducers 620 may be greater or less than ten. In some embodiments, using higher numbers of acoustic transducers 620 may increase the amount of audio information collected and/or the sensitivity and accuracy of the audio information. In contrast, using a lower number of acoustic transducers 620 may decrease the computing power required by an associated controller 650 to process the collected audio information. In addition, the position of each acoustic transducer 620 of the microphone array may vary. For example, the position of an acoustic transducer 620 may include a defined position on the user, a defined coordinate on frame 610, an orientation associated with each acoustic transducer 620, or some combination thereof.

Acoustic transducers 620(A) and 620(B) may be positioned on different parts of the user's ear, such as behind the pinna or within the auricle or fossa. Or, there may be additional acoustic transducers 620 on or surrounding the ear in addition to acoustic transducers 620 inside the ear canal. Having an acoustic transducer 620 positioned next to an ear canal of a user may enable the microphone array to collect information on how sounds arrive at the ear canal. By positioning at least two of acoustic transducers 620 on either side of a user's head (e.g., as binaural microphones), augmented-reality device 600 may simulate binaural hearing and capture a 3D stereo sound field around about a user's head. In some embodiments, acoustic transducers 620(A) and 620(B) may be connected to augmented-reality system 600 via a wired connection 630, and in other embodiments, acoustic transducers 620(A) and 620(B) may be connected to augmented-reality system 600 via a wireless connection (e.g., a Bluetooth connection). In still other embodiments, acoustic transducers 620(A) and 620(B) may not be used at all in conjunction with augmented-reality system 600.

Acoustic transducers 620 on frame 610 may be positioned along the length of the temples, across the bridge, above or below display devices 615(A) and 615(B), or some combination thereof. Acoustic transducers 620 may be oriented such that the microphone array is able to detect sounds in a wide range of directions surrounding the user wearing the augmented-reality system 600. In some embodiments, an optimization process may be performed during manufacturing of augmented-reality system 600 to determine relative positioning of each acoustic transducer 620 in the microphone array.

In some examples, augmented-reality system 600 may include or be connected to an external device (e.g., a paired device), such as neckband 605. Neckband 605 generally represents any type or form of paired device. Thus, the following discussion of neckband 605 may also apply to various other paired devices, such as charging cases, smart watches, smart phones, wrist bands, other wearable devices, hand-held controllers, tablet computers, laptop computers and other external compute devices, etc.

As shown, neckband 605 may be coupled to eyewear device 602 via one or more connectors. The connectors may be wired or wireless and may include electrical and/or non-electrical (e.g., structural) components. In some cases, eyewear device 602 and neckband 605 may operate independently without any wired or wireless connection between them. While FIG. 6 illustrates the components of eyewear device 602 and neckband 605 in example locations on eyewear device 602 and neckband 605, the components may be located elsewhere and/or distributed differently on eyewear device 602 and/or neckband 605. In some embodiments, the components of eyewear device 602 and neckband 605 may be located on one or more additional peripheral devices paired with eyewear device 602, neckband 605, or some combination thereof.

Pairing external devices, such as neckband 605, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 600 may be provided by a paired device or shared between a paired device and an eyewear device, thus reducing the weight, heat profile, and form factor of the eyewear device overall while still retaining desired functionality. For example, neckband 605 may allow components that would otherwise be included on an eyewear device to be included in neckband 605 since users may tolerate a heavier weight load on their shoulders than they would tolerate on their heads. Neckband 605 may also have a larger surface area over which to diffuse and disperse heat to the ambient environment. Thus, neckband 605 may allow for greater battery and computation capacity than might otherwise have been possible on a stand-alone eyewear device. Since weight carried in neckband 605 may be less invasive to a user than weight carried in eyewear device 602, a user may tolerate wearing a lighter eyewear device and carrying or wearing the paired device for greater lengths of time than a user would tolerate wearing a heavy standalone eyewear device, thereby enabling users to more fully incorporate artificial-reality environments into their day-to-day activities.

Neckband 605 may be communicatively coupled with eyewear device 602 and/or to other devices. These other devices may provide certain functions (e.g., tracking, localizing, depth mapping, processing, storage, etc.) to augmented-reality system 600. In the embodiment of FIG. 6, neckband 605 may include two acoustic transducers (e.g., 620(I) and 620(J)) that are part of the microphone array (or potentially form their own microphone subarray). Neckband 605 may also include a controller 625 and a power source 635.

Acoustic transducers 620(I) and 620(J) of neckband 605 may be configured to detect sound and convert the detected sound into an electronic format (analog or digital). In the embodiment of FIG. 6, acoustic transducers 620(I) and 620(J) may be positioned on neckband 605, thereby increasing the distance between the neckband acoustic transducers 620(I) and 620(J) and other acoustic transducers 620 positioned on eyewear device 602. In some cases, increasing the distance between acoustic transducers 620 of the microphone array may improve the accuracy of beamforming performed via the microphone array. For example, if a sound is detected by acoustic transducers 620(C) and 620(D) and the distance between acoustic transducers 620(C) and 620 (D) is greater than, e.g., the distance between acoustic transducers 620(D) and 620(E), the determined source location of the detected sound may be more accurate than if the sound had been detected by acoustic transducers 620(D) and 620(E).

Controller 625 of neckband 605 may process information generated by the sensors on neckband 605 and/or augmented-reality system 600. For example, controller 625 may process information from the microphone array that describes sounds detected by the microphone array. For each detected sound, controller 625 may perform a direction-of-arrival (DOA) estimation to estimate a direction from which the detected sound arrived at the microphone array. As the microphone array detects sounds, controller 625 may populate an audio data set with the information. In embodiments in which augmented-reality system 600 includes an inertial measurement unit, controller 625 may compute all inertial and spatial calculations from the IMU located on eyewear device 602. A connector may convey information between augmented-reality system 600 and neckband 605 and between augmented-reality system 600 and controller 625. The information may be in the form of optical data, electrical data, wireless data, or any other transmittable data form. Moving the processing of information generated by augmented-reality system 600 to neckband 605 may reduce weight and heat in eyewear device 602, making it more comfortable to the user.

Power source 635 in neckband 605 may provide power to eyewear device 602 and/or to neckband 605. Power source 635 may include, without limitation, lithium ion batteries, lithium-polymer batteries, primary lithium batteries, alkaline batteries, or any other form of power storage. In some cases, power source 635 may be a wired power source. Including power source 635 on neckband 605 instead of on eyewear device 602 may help better distribute the weight and heat generated by power source 635.

As noted, some artificial-reality systems may, instead of blending an artificial reality with actual reality, substantially replace one or more of a user's sensory perceptions of the real world with a virtual experience. One example of this type of system is a head-worn display system, such as virtual-reality system 700 in FIG. 7, that mostly or completely covers a user's field of view. Virtual-reality system 700 may include a front rigid body 702 and a band 704 shaped to fit around a user's head. Virtual-reality system 700 may also include output audio transducers 706(A) and 706(B). Furthermore, while not shown in FIG. 7, front rigid body 702 may include one or more electronic elements, including one or more electronic displays, one or more inertial measurement units (IMUs), one or more tracking emitters or detectors, and/or any other suitable device or system for creating an artificial reality experience.

Artificial-reality systems may include a variety of types of visual feedback mechanisms. For example, display devices in augmented-reality system 600 and/or virtual-reality system 700 may include one or more liquid crystal displays (LCDs), light emitting diode (LED) displays, organic LED (OLED) displays, and/or any other suitable type of display screen. Artificial-reality systems may include a single display screen for both eyes or may provide a display screen for each eye, which may allow for additional flexibility for varifocal adjustments or for correcting a user's refractive error. Some artificial-reality systems may also include optical subsystems having one or more lenses (e.g., conventional concave or convex lenses, Fresnel lenses, adjustable liquid lenses, etc.) through which a user may view a display screen.

In addition to or instead of using display screens, some artificial-reality systems may include one or more projection systems. For example, display devices in augmented-reality system 600 and/or virtual-reality system 700 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial-reality content and the real world. Artificial-reality systems may also be configured with any other suitable type or form of image projection system.

Artificial-reality systems may also include various types of computer vision components and subsystems. For example, augmented-reality system 500, augmented-reality system 600, and/or virtual-reality system 700 may include one or more optical sensors, such as two-dimensional (2D) or 3D cameras, time-of-flight depth sensors, single-beam or sweeping laser rangefinders, 3D LiDAR sensors, and/or any other suitable type or form of optical sensor. An artificial-reality system may process data from one or more of these sensors to identify a location of a user, to map the real world, to provide a user with context about real-world surroundings, and/or to perform a variety of other functions.

Artificial-reality systems may also include one or more input and/or output audio transducers. In the examples shown in FIGS. 5 and 7, output audio transducers 508(A), 508(B), 706(A), and 706(B) may include voice coil speakers, ribbon speakers, electrostatic speakers, piezoelectric speakers, bone conduction transducers, cartilage conduction transducers, and/or any other suitable type or form of audio transducer. Similarly, input audio transducers 510 may include condenser microphones, dynamic microphones, ribbon microphones, and/or any other type or form of input transducer. In some embodiments, a single transducer may be used for both audio input and audio output.

While not shown in FIGS. 5-10, artificial-reality systems may include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial-reality devices, within other artificial-reality devices, and/or in conjunction with other artificial-reality devices.

By providing haptic sensations, audible content, and/or visual content, artificial-reality systems may create an entire virtual experience or enhance a user's real-world experience in a variety of contexts and environments. For instance, artificial-reality systems may assist or extend a user's perception, memory, or cognition within a particular environment. Some systems may enhance a user's interactions with other people in the real world or may enable more immersive interactions with other people in a virtual world. Artificial-reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visuals aids, etc.). The embodiments disclosed herein may enable or enhance a user's artificial-reality experience in one or more of these contexts and environments and/or in other contexts and environments.

As noted, artificial-reality systems 500, 600, and 700 may be used with a variety of other types of devices to provide a more compelling artificial-reality experience. These devices may be haptic interfaces with transducers that provide haptic feedback and/or that collect haptic information about a user's interaction with an environment. The artificial-reality systems disclosed herein may include various types of haptic interfaces that detect or convey various types of haptic information, including tactile feedback (e.g., feedback that a user detects via nerves in the skin, which may also be referred to as cutaneous feedback) and/or kinesthetic feedback (e.g., feedback that a user detects via receptors located in muscles, joints, and/or tendons).

Figure 8:
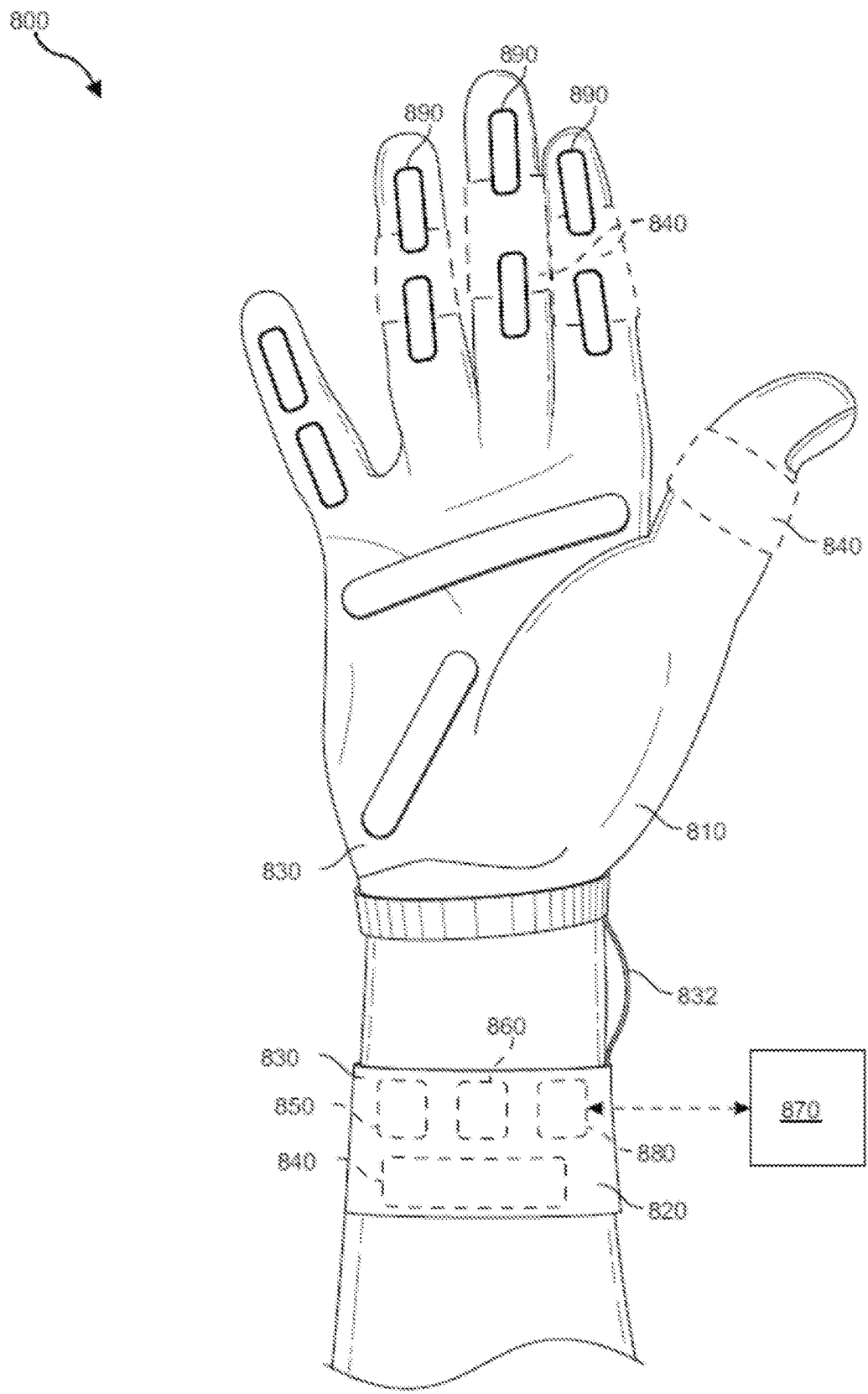
FIG. 8 is an illustration of exemplary haptic devices that may be used in connection with embodiments of this disclosure.

Haptic feedback may be provided by interfaces positioned within a user's environment (e.g., chairs, tables, floors, etc.) and/or interfaces on articles that may be worn or carried by a user (e.g., gloves, wristbands, etc.). As an example, FIG. 8 illustrates a vibrotactile system 800 in the form of a wearable glove (haptic device 810) and wristband (haptic device 820). Haptic device 810 and haptic device 820 are shown as examples of wearable devices that include a flexible, wearable textile material 830 that is shaped and configured for positioning against a user's hand and wrist, respectively. This disclosure also includes vibrotactile systems that may be shaped and configured for positioning against other human body parts, such as a finger, an arm, a head, a torso, a foot, or a leg. By way of example and not limitation, vibrotactile systems according to various embodiments of the present disclosure may also be in the form of a glove, a headband, an armband, a sleeve, a head covering, a sock, a shirt, or pants, among other possibilities. In some examples, the term "textile" may include any flexible, wearable material, including woven fabric, non-woven fabric, leather, cloth, a flexible polymer material, composite materials, etc.

One or more vibrotactile devices 840 may be positioned at least partially within one or more corresponding pockets formed in textile material 830 of vibrotactile system 800. Vibrotactile devices 840 may be positioned in locations to provide a vibrating sensation (e.g., haptic feedback) to a user of vibrotactile system 800. For example, vibrotactile devices 840 may be positioned to be against the user's finger(s), thumb, or wrist, as shown in FIG. 8. Vibrotactile devices 840 may, in some examples, be sufficiently flexible to conform to or bend with the user's corresponding body part(s).

A power source 850 (e.g., a battery) for applying a voltage to the vibrotactile devices 840 for activation thereof may be electrically coupled to vibrotactile devices 840, such as via conductive wiring 852. In some examples, each of vibrotactile devices 840 may be independently electrically coupled to power source 850 for individual activation. In some embodiments, a processor 860 may be operatively coupled to power source 850 and configured (e.g., programmed) to control activation of vibrotactile devices 840.

Vibrotactile system 800 may be implemented in a variety of ways. In some examples, vibrotactile system 800 may be a standalone system with integral subsystems and components for operation independent of other devices and systems. As another example, vibrotactile system 800 may be configured for interaction with another device or system 870. For example, vibrotactile system 800 may, in some examples, include a communications interface 880 for receiving and/or sending signals to the other device or system 870. The other device or system 870 may be a mobile device, a gaming console, an artificial-reality (e.g., virtual-reality, augmented-reality, mixed-reality) device, a personal computer, a tablet computer, a network device (e.g., a modem, a router, etc.), a handheld controller, etc. Communications interface 880 may enable communications between vibrotactile system 800 and the other device or system 870 via a wireless (e.g., Wi-Fi, Bluetooth, cellular, radio, etc.) link or a wired link. If present, communications interface 880 may be in communication with processor 860, such as to provide a signal to processor 860 to activate or deactivate one or more of the vibrotactile devices 840.

Vibrotactile system 800 may optionally include other subsystems and components, such as touch-sensitive pads 890, pressure sensors, motion sensors, position sensors, lighting elements, and/or user interface elements (e.g., an on/off button, a vibration control element, etc.). During use, vibrotactile devices 840 may be configured to be activated for a variety of different reasons, such as in response to the user's interaction with user interface elements, a signal from the motion or position sensors, a signal from the touch-sensitive pads 890, a signal from the pressure sensors, a signal from the other device or system 870, etc.

Although power source 850, processor 860, and communications interface 880 are illustrated in FIG. 8 as being positioned in haptic device 820, the present disclosure is not so limited. For example, one or more of power source 850, processor 860, or communications interface 880 may be positioned within haptic device 810 or within another wearable textile.

Figure 9:
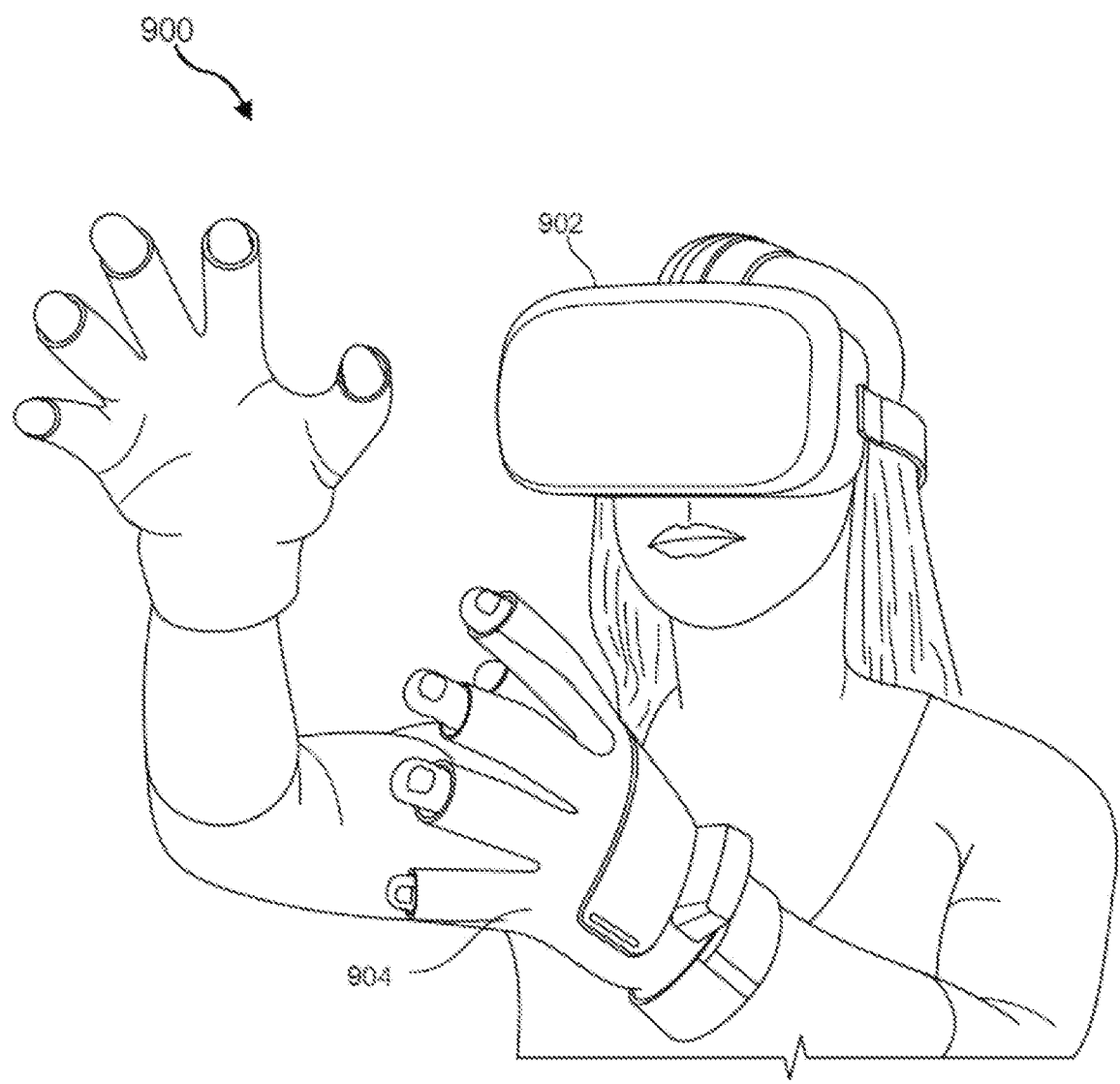
FIG. 9 is an illustration of an exemplary virtual-reality environment according to embodiments of this disclosure.

Haptic wearables, such as those shown in and described in connection with FIG. 8, may be implemented in a variety of types of artificial-reality systems and environments. FIG. 9 shows an example artificial-reality environment 900 including one head-mounted virtual-reality display and two haptic devices (i.e., gloves), and in other embodiments any number and/or combination of these components and other components may be included in an artificial-reality system. For example, in some embodiments there may be multiple head-mounted displays each having an associated haptic device, with each head-mounted display and each haptic device communicating with the same console, portable computing device, or other computing system.

Figure 7:
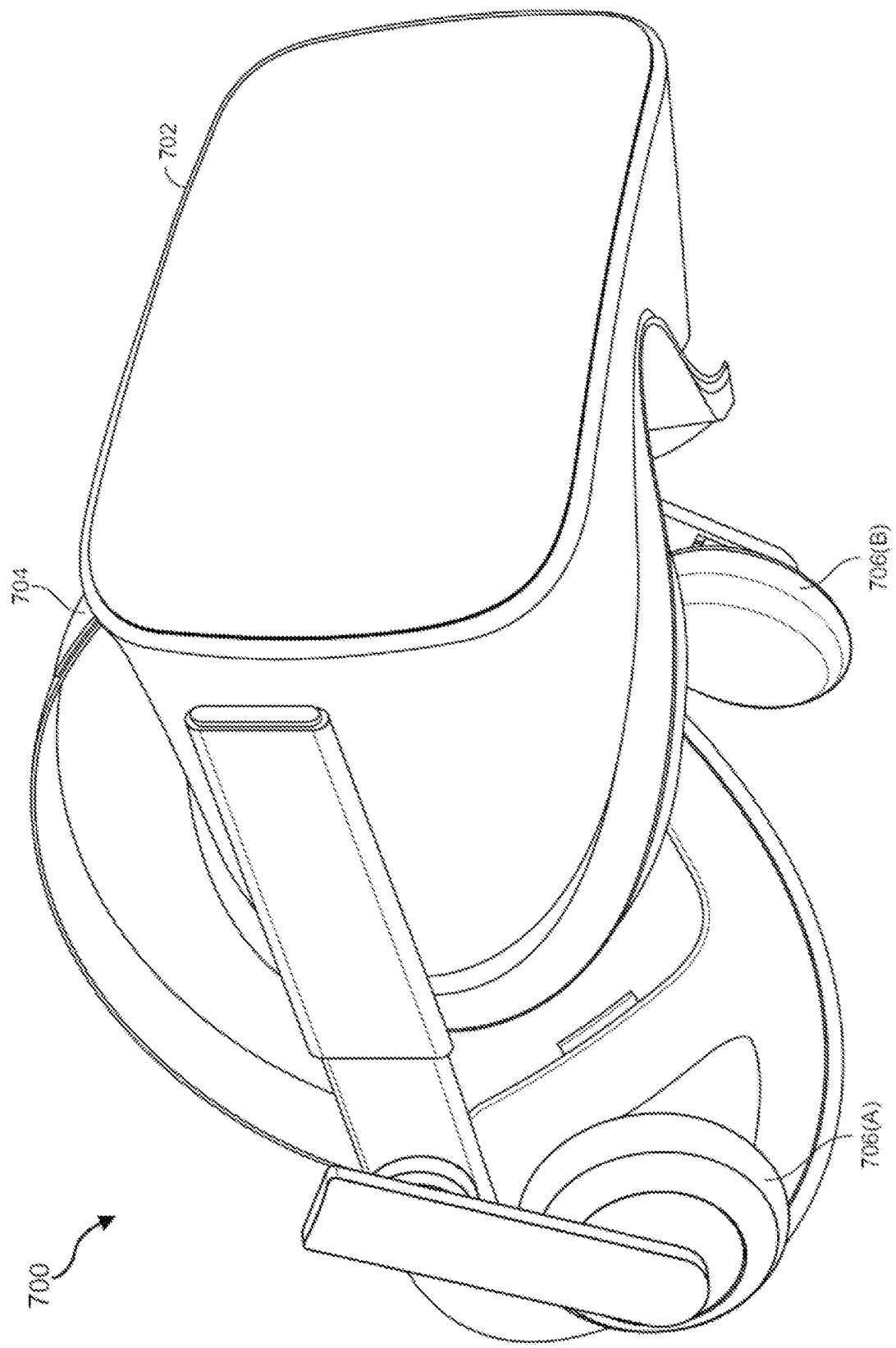
FIG. 7 is an illustration of an exemplary virtual-reality headset that may be used in connection with embodiments of this disclosure.

Head-mounted display 902 generally represents any type or form of virtual-reality system, such as virtual-reality system 700 in FIG. 7. Haptic device 904 generally represents any type or form of wearable device, worn by a use of an artificial-reality system, that provides haptic feedback to the user to give the user the perception that he or she is physically engaging with a virtual object. In some embodiments, haptic device 904 may provide haptic feedback by applying vibration, motion, and/or force to the user. For example, haptic device 904 may limit or augment a user's movement. To give a specific example, haptic device 904 may limit a user's hand from moving forward so that the user has the perception that his or her hand has come in physical contact with a virtual wall. In this specific example, one or more actuators within the haptic advice may achieve the physical-movement restriction by pumping fluid into an inflatable bladder of the haptic device. In some examples, a user may also use haptic device 904 to send action requests to a console. Examples of action requests include, without limitation, requests to start an application and/or end the application and/or requests to perform a particular action within the application.

Figure 10:
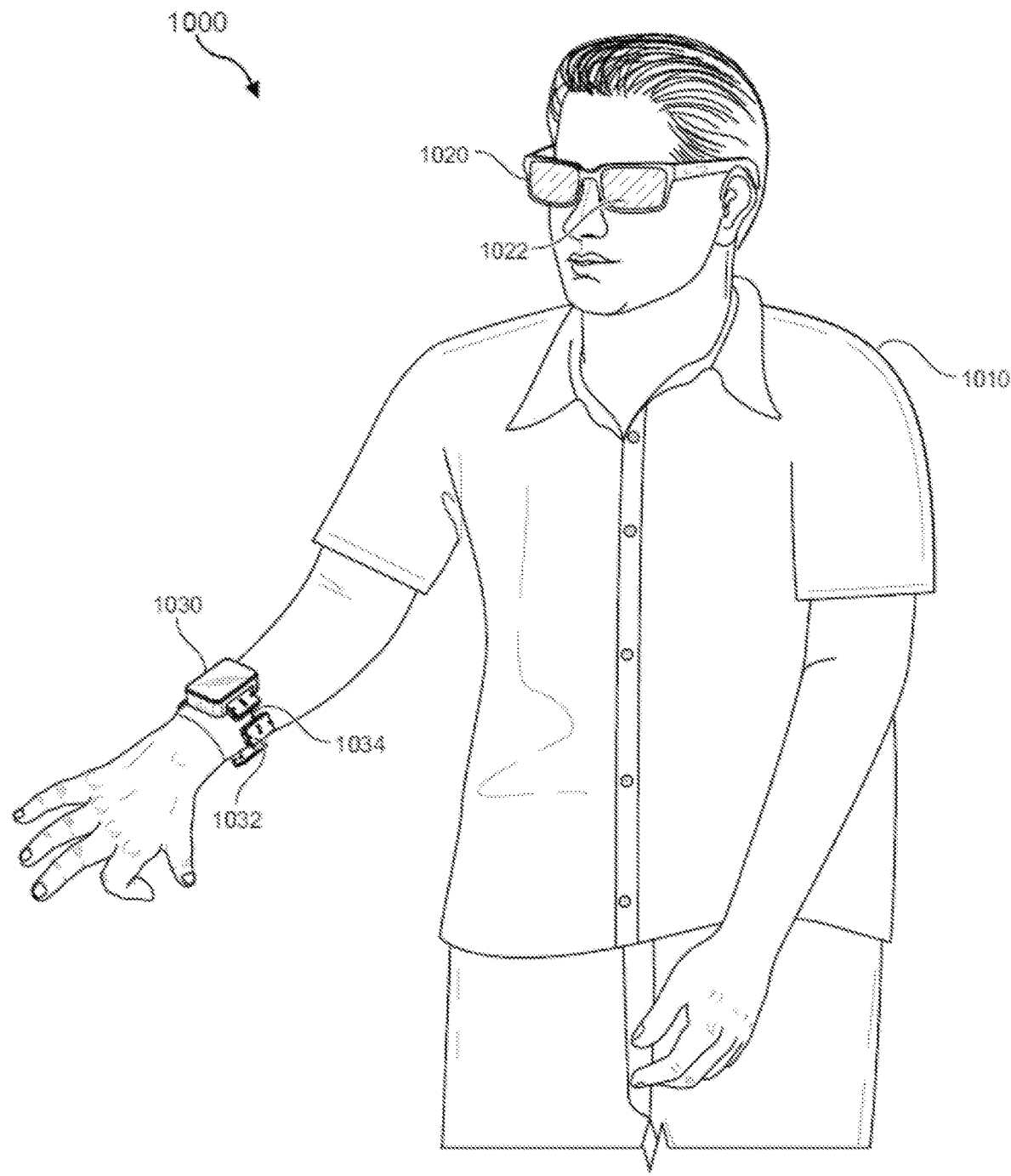
FIG. 10 is an illustration of an exemplary augmented-reality environment according to embodiments of this disclosure.

While haptic interfaces may be used with virtual-reality systems, as shown in FIG. 9, haptic interfaces may also be used with augmented-reality systems, as shown in FIG. 10. FIG. 10 is a perspective view a user 1010 interacting with an augmented-reality system 1000. In this example, user 1010 may wear a pair of augmented-reality glasses 1020 that have one or more displays 1022 and that are paired with a haptic device 1030. Haptic device 1030 may be a wristband that includes a plurality of band elements 1032 and a tensioning mechanism 1034 that connects band elements 1032 to one another.

One or more of band elements 1032 may include any type or form of actuator suitable for providing haptic feedback. For example, one or more of band elements 1032 may be configured to provide one or more of various types of cutaneous feedback, including vibration, force, traction, texture, and/or temperature. To provide such feedback, band elements 1032 may include one or more of various types of actuators. In some embodiments, an actuator may include a layer of nanovoided polymer sandwiched between conductive electrodes. In one example, each of band elements 1032 may include a vibrotactor (e.g., a vibrotactile actuator) configured to vibrate in unison or independently to provide one or more of various types of haptic sensations to a user. Alternatively, only a single band element or a subset of band elements may include vibrotactors.

Haptic devices 810, 820, 904, and 1030 may include any suitable number and/or type of haptic transducer, sensor, and/or feedback mechanism. For example, haptic devices 810, 820, 904, and 1030 may include one or more mechanical transducers, piezoelectric transducers, and/or fluidic transducers. Haptic devices 810, 820, 904, and 1030 may also include various combinations of different types and forms of transducers that work together or independently to enhance a user's artificial-reality experience. In one example, each of band elements 1032 of haptic device 1030 may include a vibrotactor (e.g., a vibrotactile actuator)

configured to vibrate in unison or independently to provide one or more of various types of haptic sensations to a user.

FIG. 11 is a flow diagram illustrating method 1100 for operating an optical transformer in accordance with some embodiments.

Method 1100 includes (1102) receiving an electrical input to any optical transformer described herein (e.g., the optical transformer 100 shown in FIG. 1A), and generating light with one or more light sources of the first subset of the plurality of light sources of the optical transformer.

In some embodiments, method 1100 also includes (1104) generating light with a first group of one or more light sources of the second subset of the plurality of light sources and providing the light from the first group of one or more light sources to a first subset of the one or more optically triggered switches at a first time; and forgoing generation of light with the first group of one or more light sources of the second subset of the plurality of light sources and provision of the light from the first group of one or more light sources to the first subset of the one or more optically triggered switches at a second time that is distinct from the first time.

In some embodiments, method 1100 also includes (1106) generating light with a first group of one or more light sources of the second subset of the plurality of light sources and providing the light from the first group of one or more light sources to a first subset of the one or more optically triggered switches at a first time, and generating light with a second group of one or more light sources of the second subset of the plurality of light sources and providing the light from the second group of one or more light sources to a second subset of the one or more optically triggered switches at a second time that is distinct from the first time.

Method 1100 also includes (1108) providing the light to the plurality of photovoltaic cells of the optical transformer to obtain an electrical output.

In some embodiments, the electrical input has (1110) a first voltage and the electrical output has a second voltage that is greater than the first voltage. Thus, the optical transformer 100 may be used to convert (e.g., increase) the voltage of an electrical input.

In some embodiments, the second voltage is less than the first voltage. Such configurations may be used in voltage discharge or electrical insulation devices.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An optical transformer, comprising:
   a plurality of light emitters;
   a plurality of photovoltaic cells positioned to receive light from at least a first subset of the plurality of light emitters, the plurality of photovoltaic cells including at least a first photovoltaic cell and a second photovoltaic cell; and
   one or more optically triggered switches positioned to receive light from at least a second subset of the plurality of light emitters, the one or more optically triggered switches including at least a first optically triggered switch electrically coupled to the first photovoltaic cell and the second photovoltaic cell.

2. The optical transformer of claim 1, wherein the first optically triggered switch electrically couples the first photovoltaic cell and the second photovoltaic cell while the first optically triggered switch is in a first illumination state and the first optically triggered switch forgoes electrically coupling the first photovoltaic cell and the second photovoltaic cell while the first optically triggered switch is in a second illumination state that is distinct from the first illumination state.

3. The optical transformer of claim 2, wherein the first optically triggered switch electrically couples the first photovoltaic cell and the second photovoltaic cell in series while the first optically triggered switch is in the first illumination state.

4. The optical transformer of claim 2, wherein the first optically triggered switch electrically couples the first photovoltaic cell and the second photovoltaic cell in parallel while the first optically triggered switch is in the first illumination state.

5. The optical transformer of claim 1, wherein:
   the one or more optically triggered switches include a second optical switch electrically coupled to one photovoltaic cell of the plurality of photovoltaic cells and a drain channel.

6. The optical transformer of claim 1, wherein:
   the one or more optically triggered switches include a third optical switch electrically coupled to one photovoltaic cell of the plurality of photovoltaic cells and a storage capacitor.

7. The optical transformer of claim 1, wherein:
   the one or more optically triggered switches include a reverse polarity circuit.

8. The optical transformer of claim 7, wherein:
   the reverse polarity circuit has first and second input channels, first and second output channels, and at least four optically triggered switches, including an optically triggered switch electrically coupled to the first input channel and the first output channel, an optically triggered switch electrically coupled to the first input channel and the second output channel, an optically triggered switch electrically coupled to the second input channel and the first output channel, and an optically triggered switch electrically coupled to the second input channel and the second output channel.

9. The optical transformer of claim 1, wherein:
at least one optically triggered switch of the plurality of optically triggered switches is made of a photoconductive material selected from semi-insulating gallium arsenide, low temperature grown gallium arsenide, proton implanted gallium arsenide, chromium-doped gallium arsenide, amorphous silicon, silicon on sapphire, indium phosphide, gallium phosphide, gallium nitride, or a combination thereof.

10. The optical transformer of claim 1, wherein:
at least one optically triggered switch of the plurality of optically triggered switches is a photovoltaic cell.

11. The optical transformer of claim 1, wherein:
at least one optically triggered switch of the plurality of optically triggered switches includes of electrodes positioned on a photoconductive material, the electrodes being separated from each other.

12. The optical transformer of claim 1, wherein:
at least one optically triggered switch of the plurality of optically triggered switches includes of electrodes separated by a photoconductive material.

13. The optical transformer of claim 1, wherein the plurality of light emitters is individually activatable.

14. The optical transformer of claim 1, wherein a light emitter of the plurality of light emitters includes a light-emitting diode or a laser.

15. The optical transformer of claim 1, further comprising an optically-transparent electrical isolation layer located between the plurality of light emitters and the plurality of photovoltaic cells.

16. The optical transformer of claim 1, further comprising:
one or more processors; and
memory storing instructions for execution by the one or more processors, the stored instructions including instructions for:
monitoring a load condition of the optical transformer; and
adjusting activation of the plurality of light emitters.

17. A method, comprising:
receiving an electrical input to the optical transformer of claim 1 and generating light with one or more light emitters of the first subset of the plurality of light emitters of the optical transformer; and
providing the light to the plurality of photovoltaic cells of the optical transformer to obtain an electrical output.

18. The method of claim 17, wherein the electrical input has a first voltage and the electrical output has a second voltage that is greater than the first voltage.

19. The method of claim 17, further comprising:
generating light with a first group of one or more light emitters of the second subset of the plurality of light emitters and providing the light from the first group of one or more light emitters to a first subset of the one or more optically triggered switches at a first time; and
forgoing generation of light with the first group of one or more light emitters of the second subset of the plurality of light emitters and provision of the light from the first group of one or more light emitters to the first subset of the one or more optically triggered switches at a second time that is distinct from the first time.

20. The method of claim 17, further comprising:
generating light with a first group of one or more light emitters of the second subset of the plurality of light emitters and providing the light from the first group of one or more light emitters to a first subset of the one or more optically triggered switches at a first time; and
generating light with a second group of one or more light emitters of the second subset of the plurality of light emitters and providing the light from the second group of one or more light emitters to a second subset of the one or more optically triggered switches at a second time that is distinct from the first time.

* * * * *

UNITED STATES PATENT AND TRADEMARK OFFICE
CERTIFICATE OF CORRECTION

PATENT NO. : 11,431,236 B2
APPLICATION NO. : 16/996588
DATED : August 30, 2022
INVENTOR(S) : Scheller et al.

It is certified that error appears in the above-identified patent and that said Letters Patent is hereby corrected as shown below:

In the Claims

Claim 11, Column 25, Line 15, please delete "includes of electrodes" and insert --includes electrodes--;

Claim 12, Column 25, Line 20, please delete "includes of electrodes" and insert --includes electrodes--.

Signed and Sealed this
Twenty-second Day of November, 2022

Katherine Kelly Vidal
*Director of the United States Patent and Trademark Office*